US012431415B2

(12) United States Patent
Liao et al.

(10) Patent No.: US 12,431,415 B2
(45) Date of Patent: Sep. 30, 2025

(54) BUFFER BLOCK STRUCTURES FOR C4 BONDING AND METHODS OF USING THE SAME

(71) Applicant: Taiwan Semiconductor Manufacturing Company Limited, Hsinchu (TW)

(72) Inventors: Li-Ling Liao, Hsinchu (TW); Ming-Chih Yew, Hsinchu (TW); Chia-Kuei Hsu, Hsinchu (TW); Po-Yao Lin, Zhudong Township (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 827 days.

(21) Appl. No.: 17/730,410

(22) Filed: Apr. 27, 2022

(65) Prior Publication Data

US 2023/0352381 A1 Nov. 2, 2023

(51) Int. Cl.
*H01L 23/498* (2006.01)
*H01L 21/48* (2006.01)
(Continued)

(52) U.S. Cl.
CPC .... *H01L 23/49816* (2013.01); *H01L 21/4853* (2013.01); *H01L 23/49822* (2013.01); *H01L 23/49833* (2013.01); *H01L 23/49838* (2013.01); *H01L 23/49894* (2013.01); *H01L 24/16* (2013.01); *H01L 24/32* (2013.01); *H01L 25/0652* (2013.01); *H01L 24/73* (2013.01); *H01L 25/0657* (2013.01); *H01L 2224/16145* (2013.01); *H01L 2224/16227* (2013.01); *H01L 2224/32145* (2013.01); *H01L 2224/32225* (2013.01); *H01L 2224/73204* (2013.01); *H01L 2225/06513* (2013.01); *H01L 2225/06517* (2013.01); *H01L 2225/06524* (2013.01); *H01L 2924/1432* (2013.01); *H01L 2924/1437* (2013.01); *H01L 2924/3511* (2013.01);
(Continued)

(58) Field of Classification Search
CPC ......... H01L 23/49816; H01L 23/49822; H01L 23/49833
See application file for complete search history.

(56) References Cited

U.S. PATENT DOCUMENTS

2004/0004292 A1* 1/2004 Hsieh ...................... H01L 24/29 257/737
2022/0020664 A1* 1/2022 Lee ..................... H01L 25/0657

* cited by examiner

*Primary Examiner* — Errol V Fernandes
(74) *Attorney, Agent, or Firm* — The Marbury Law Group, PLLC

(57) ABSTRACT

A semiconductor structure includes a fan-out package comprising at least one semiconductor die, a redistribution structure including fan-out bonding pads, and a first underfill material portion located between the at least one semiconductor die and the redistribution structure; a packaging substrate comprising chip-side bonding pads; an array of solder material portions bonded to the chip-side bonding pads and the fan-out bonding pads; a second underfill material portion laterally surrounding the array of solder material portions; and at least one buffer block structure located between a respective neighboring pair of solder material portions within the array of solder material portions and between the fan-out package and the packaging substrate, and laterally surrounded by the second underfill material portion.

20 Claims, 38 Drawing Sheets

(51) Int. Cl.
*H01L 23/00* (2006.01)
*H01L 25/065* (2023.01)

(52) U.S. Cl.
CPC ................. *H01L 2924/3512* (2013.01); *H01L 2924/3841* (2013.01)

BUFFER BLOCK STRUCTURES FOR C4 BONDING AND METHODS OF USING THE SAME

BACKGROUND

Controlled collapse chip connection (C4) bonding uses reflow of an array of solder balls between mating pairs of bonding structure between two substrates. The solder balls bonded to a respective mating pair of bonding structures are referred to as C4 joints. The solder ball reflow process is a sensitive process that may cause bridging between neighboring pairs of solder balls and induce electrical shorts (unintended electrical connections) between the reflowed solder joints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
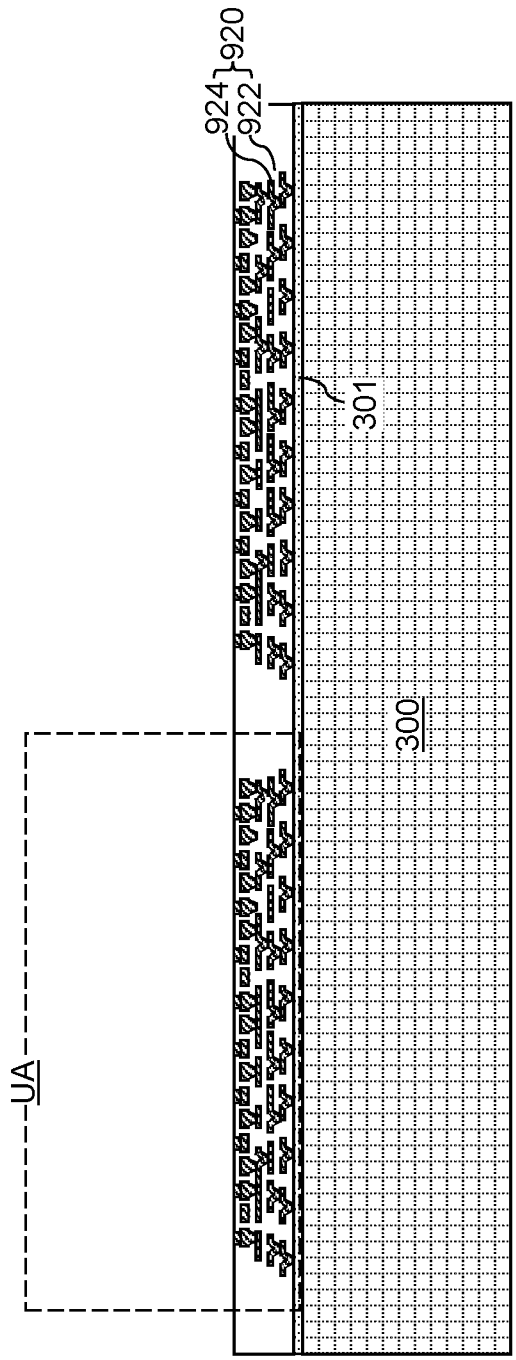
FIG. 1A is a vertical cross-sectional view of a region of an exemplary structure that includes a first carrier substrate and redistribution structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments disclosed herein are directed to semiconductor devices, and particularly to bump-level structures in semiconductor die packaging. Specifically, the methods and structures of the present disclosure are directed to buffer block structures for C4 bonding and methods of using the same. The methods and structures of the present disclosure may be used to provide a chip package structure such as a fan out wafer level package (FOWLP) and fan-out panel level package (FOPLP). While the present disclosure is described using an FOWLP configuration, the methods and structures of the present disclosure may be implemented in an FOPLP configuration or any other fan-out package configuration.

Typically, heterogeneous integration is used to integrate a large interposer (such as a chip-on-wafer-on-substrate (CoWoS®) interposer or an organic interposer) and a high electrical performance substrate (such as a multi-layer core or a multilayer substrate (which may include 12 or more layers) for a high performance chip. Bumps such as controlled collapse chip connection (C4) bumps may be used to provide high-speed electrical communication between a chip package and a packaging substrate. Such bumps are affected by warpage of the chip package and/or the packaging substrate during bonding and/or subsequent handling, which may cause electrical shorts (i.e., unintended electrical connections) through joint bridging or electrical opens (i.e., unintended electrical disconnections) through cracked bump structures. According to an aspect of the present disclosure, buffer block structures including a dielectric material may be placed between neighboring pairs of bumps to provide additional structural support prior to reflow of the bumps as well as during bonding of the bumps and to prevent and/or reduce warpage of the chip package and/or the packaging substrate. The buffer block structures may eliminate or reduce bumps-joint bridges so as to improve joint formation process window for package manufacture processes.

Figure 1B:
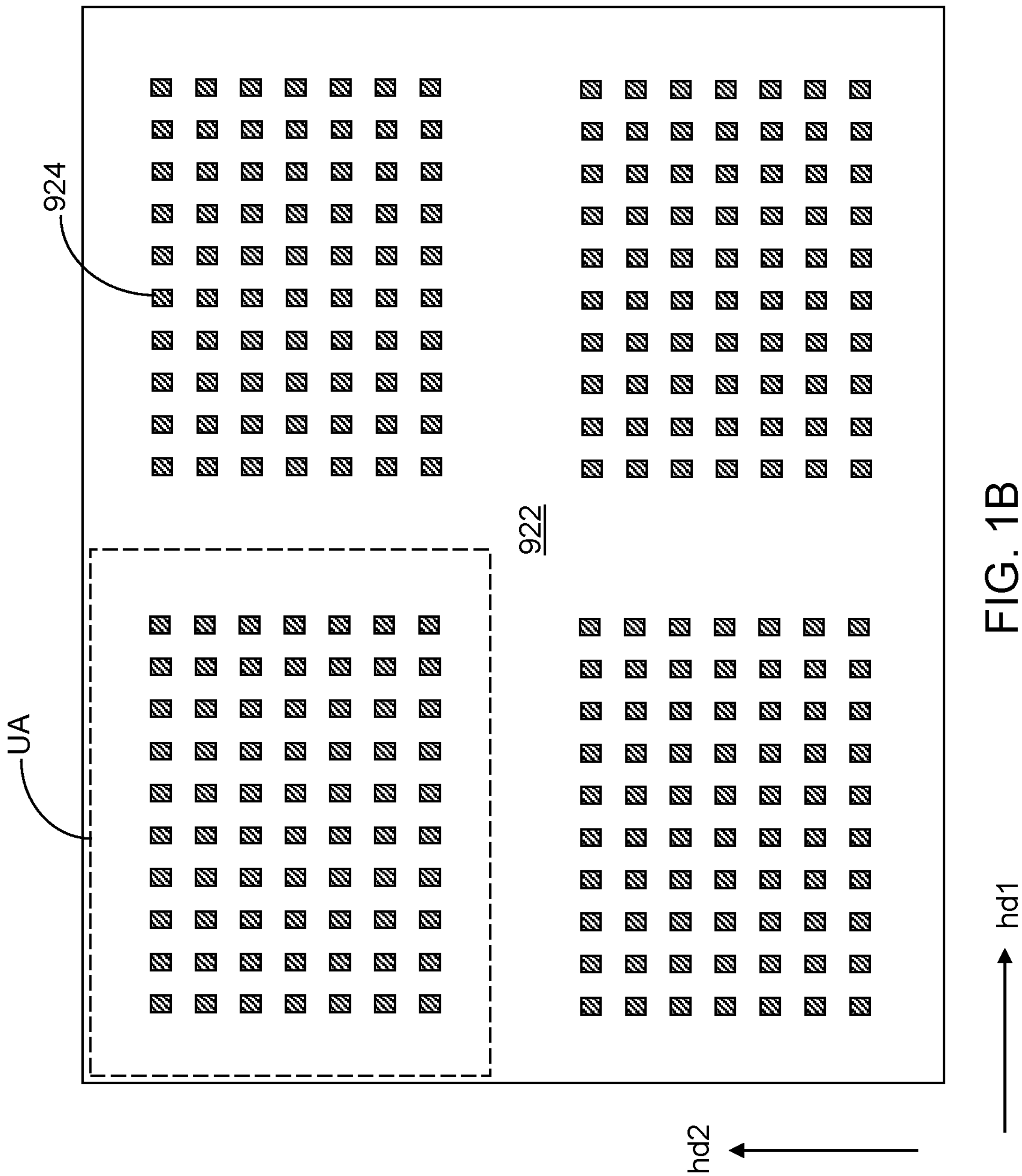
FIG. 1B is a top-down view of the region of the exemplary structure of FIG. 1A.

Referring to FIGS. 1A and 1B, an exemplary structure according to an embodiment of the present disclosure may include a first carrier substrate 300 and redistribution structures 920 formed on a front side surface of the first carrier substrate 300. The first carrier substrate 300 may include an optically transparent substrate such as a glass substrate or a sapphire substrate. Alternatively, the first carrier substrate 300 may be provided in a rectangular panel format. The dimensions of the first carrier in such alternative embodiments may be substantially the same.

A first adhesive layer 301 may be applied to the front-side surface of the first carrier substrate 300. In one embodiment, the first adhesive layer 301 may be a light-to-heat conversion (LTHC) layer. Redistribution structures 920 may be formed over the first adhesive layer 301. Specifically, a redistribution structure 920 may be formed within each unit area UA, which is the area of a repetition unit that may be repeated in a two-dimensional array over the first carrier substrate 300. Each redistribution structure 920 may include redistribution dielectric layers 922 and redistribution wiring interconnects 924. The redistribution dielectric layers 922 may include a respective dielectric polymer material such as polyimide (PI), benzocyclobutene (BCB), or polybenzobisoxazole (PBO). Other suitable dielectric materials may be within the contemplated scope of disclosure. Each redistribution dielectric layer 922 may be formed by spin coating and drying of the respective dielectric polymer material. The thickness of each redistribution dielectric layer 922 may be in a range from 2 microns to 40 microns, such as from 4 microns to 20 microns. Each redistribution dielectric layer 922 may be patterned, for example, by applying and patterning a respective photoresist layer thereabove, and by transferring the pattern in the photoresist layer into the redistribution dielectric layer 922 using an etch process such as an anisotropic etch process. The photoresist layer may be subsequently removed, for example, by ashing.

Each of the redistribution wiring interconnects 924 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 400 nm, and the copper seed layer may have a thickness in a range from 100 nm to 500 nm. The metallic fill material for the redistribution wiring interconnects 924 may include copper, nickel, or copper and nickel. Other suitable metallic fill materials are within the contemplated scope of disclosure. The thickness of the metallic fill material that is deposited for each redistribution wiring interconnect 924 may be in a range from 2 microns to 40 microns, such as from 4 microns to 10 microns, although lesser or greater thicknesses may also be used. The total number of levels of wiring in each redistribution structure 920 (i.e., the levels of the redistribution wiring interconnects 924) may be in a range from 1 to 10.

A periodic two-dimensional array (such as a rectangular array) of redistribution structures 920 may be formed over the first carrier substrate 300. Each redistribution structure 920 may be formed within a unit area UA. The layer including all redistribution structures 920 is herein referred to as a redistribution structure layer. The redistribution structure layer includes a two-dimensional array of redistribution structures 920. In one embodiment, the two-dimensional array of redistribution structures 920 may be a rectangular periodic two-dimensional array of redistribution structures 920 having a first periodicity along a first horizontal direction hd1 and having a second periodicity along a second horizontal direction hd2 that is perpendicular to the first horizontal direction hd1.

Figure 2A:
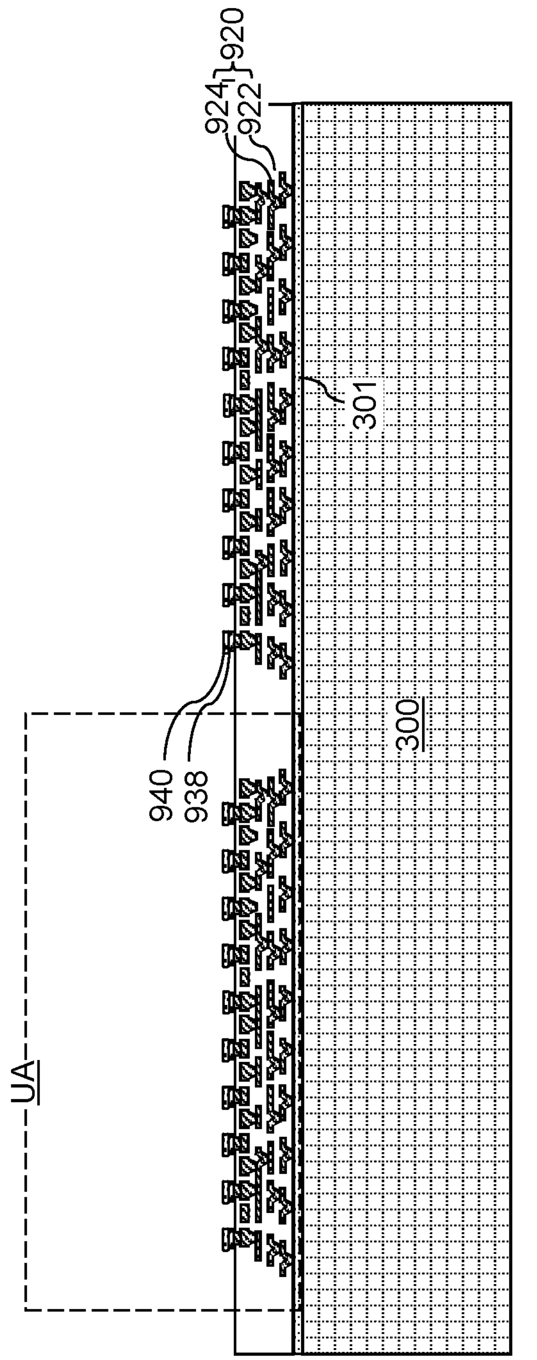
FIG. 2A is vertical cross-sectional view of a region of the exemplary structure after formation of redistribution-side bonding structures and first solder material portions according to an embodiment of the present disclosure.
Figure 2B:
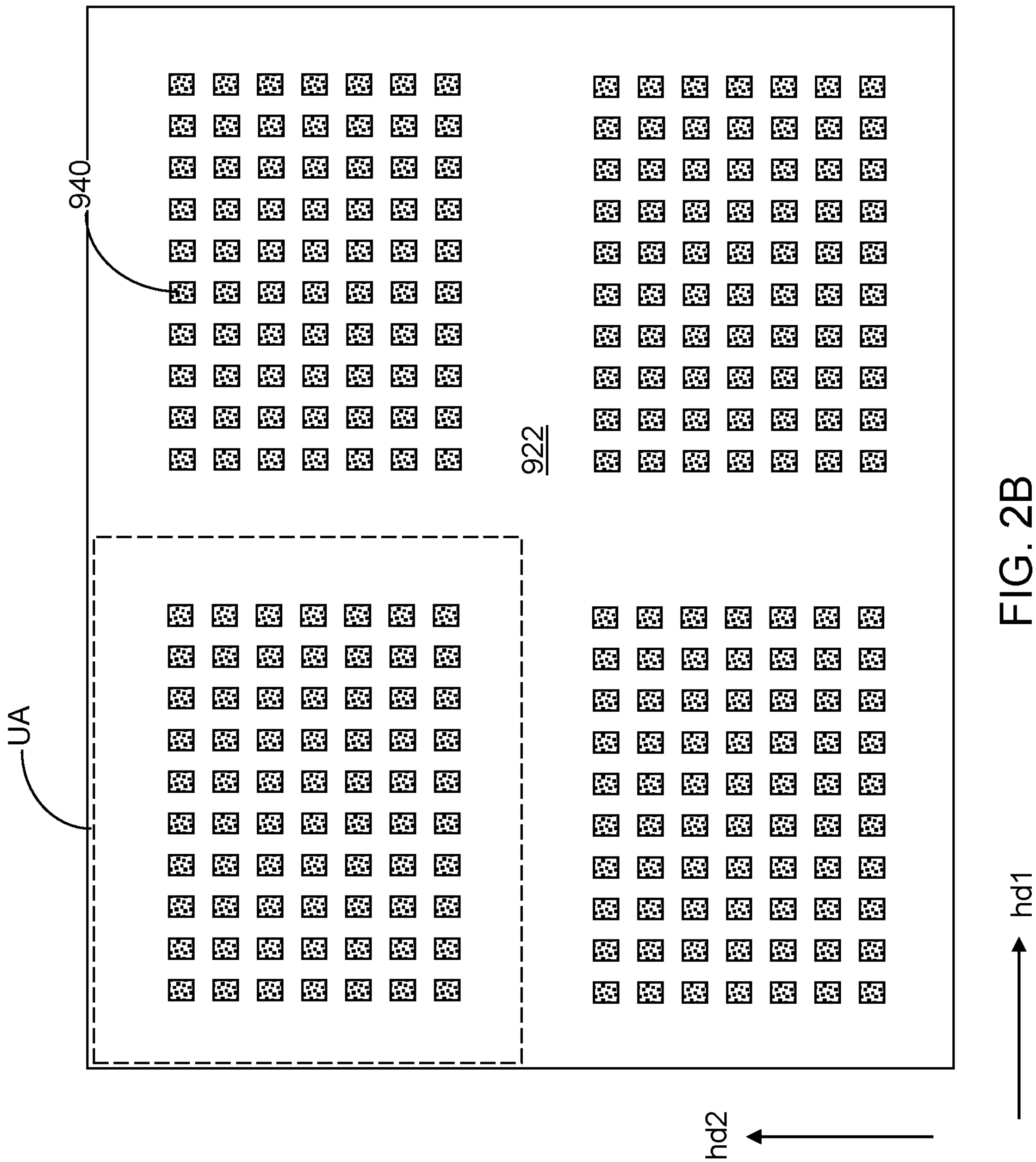
FIG. 2B is a top-down view of the region of the exemplary structure of FIG. 2A.

Referring to FIGS. 2A and 2B, at least one metallic material and a first solder material may be sequentially deposited over the front-side surface of the redistribution structures 920. The at least one metallic material comprises a material that may be used for metallic bumps, such as copper. The thickness of the at least one metallic material may be in a range from 5 microns to 60 microns, such as from 10 microns to 30 microns, although lesser and greater thicknesses may also be used. The first solder material may comprise a solder material suitable for C2 bonding, i.e., for microbump bonding. The thickness of the first solder material may be in a range from 2 microns to 30 microns, such as from 4 microns to 15 microns, although lesser and greater thicknesses may also be used.

The first solder material and the at least one metallic material may be patterned into discrete arrays of first solder material portions 940 and arrays of metal bonding structures, which are herein referred to as arrays of redistribution-side bonding structures 938. Each array of redistribution-side bonding structures 938 is formed within a respective unit area UA. Each array of first solder material portions 940 may be formed within a respective unit area UA. Each first solder material portion 940 may have a same horizontal cross-sectional shape as an underlying redistribution-side bonding structures 938. In one embodiment, the redistribution-side bonding structures 938 may include, and/or may consist essentially of, copper or a copper-containing alloy. In one embodiment, redistribution-side bonding structures 938 may be configured for microbump bonding (i.e., C2 bonding), and may have a thickness in a range from 10 microns to 30 microns, although lesser or greater thicknesses may also be used.

Figure 3A:
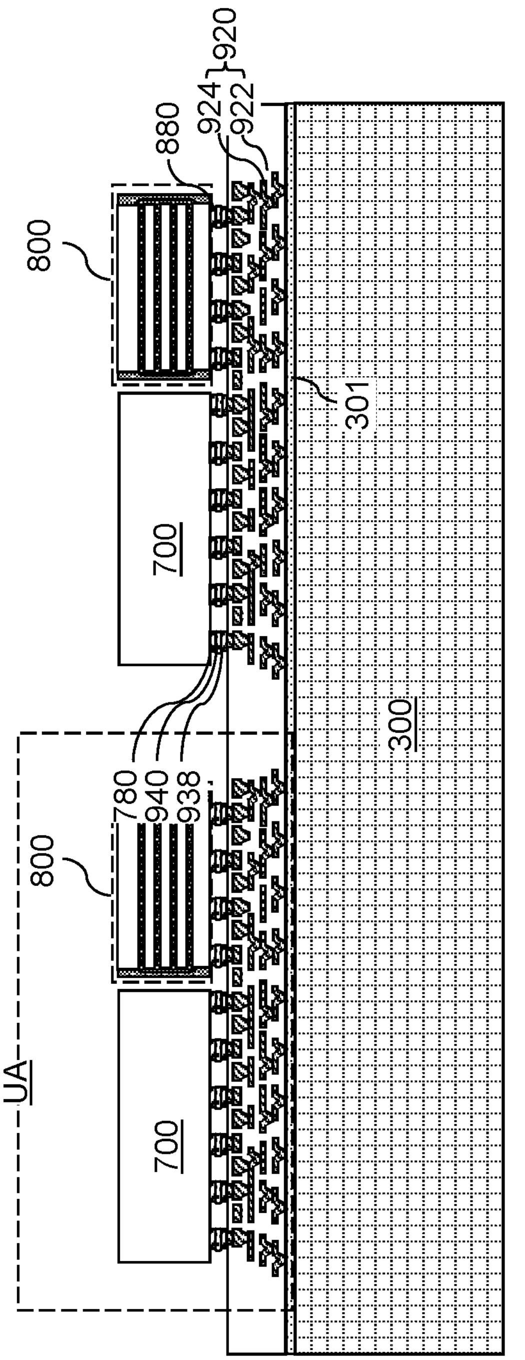
FIG. 3A is a vertical cross-sectional view of a region the exemplary structure after attaching semiconductor dies according to an embodiment of the present disclosure.
Figure 3B:
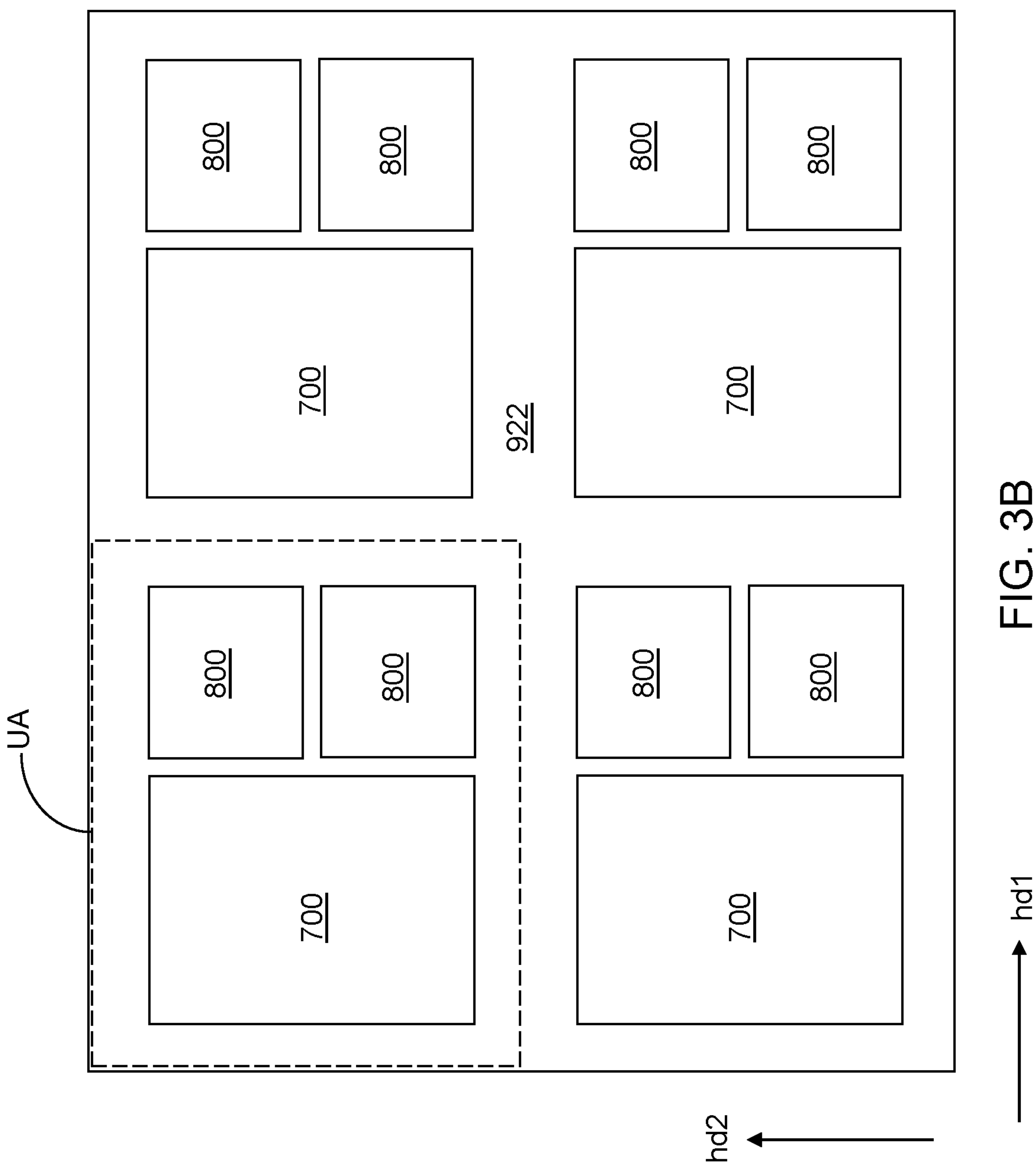
FIG. 3B is a top-down view of the region of the exemplary structure of FIG. 4A.

Referring to FIGS. 3A and 3B, a set of at least one semiconductor die (700, 800) may be bonded to each redistribution structure 920. In one embodiment, the redistribution structures 920 may be arranged as a two-dimensional periodic array, and multiple sets of at least one semiconductor die (700, 800) may be bonded to the redistribution structures 920 as a two-dimensional periodic rectangular array of sets of the at least one semiconductor die (700, 800). Each set of at least one semiconductor die (700, 800) includes at least one semiconductor die. Each set of at least one semiconductor die (700, 800) may include any set of at least one semiconductor die known in the art. In one embodiment, each set of at least one semiconductor die (700, 800) may comprise a plurality of semiconductor dies (700, 800). For example, each set of at least one semiconductor die (700, 800) may include at least one system-on-chip (SoC) die 700 and/or at least one memory die 800. Each SoC die 700 may comprise an application processor die, a central processing unit die, or a graphic processing unit die. In one embodiment, the at least one memory die 800 may comprise a high bandwidth memory (HBM) die that includes a vertical stack of static random access memory dies. In one embodiment, the at least one semiconductor die (700, 800) may include at least one system-on-chip (SoC) die and a high bandwidth memory (HBM) die including a vertical stack of static random access memory (SRAM) dies that are interconnected to one another through microbumps and are laterally surrounded by an epoxy molding material enclosure frame. In some embodiments, a top surface of an SoC die 700 may be higher than a top surface of a memory die 800 after connecting to the redistribution structure 920.

Each semiconductor die (700, 800) may comprise a respective array of die-side bonding structures (780, 880). For example, each SoC die 700 may comprise an array of SoC metal bonding structures 780, and each memory die 800 may comprise an array of memory-die metal bonding structures 880. Each of the semiconductor dies (700, 800) may be positioned in a face-down position such that die-side bonding structures (780, 880) face the first solder material portions 940. Each set of at least one semiconductor die (700, 800) may be placed within a respective unit area UA. Placement of the semiconductor dies (700, 800) may be performed using a pick and place apparatus such that each of the die-side bonding structures (780, 880) may be placed on a top surface of a respective one of the first solder material portions 940.

Generally, a redistribution structure 920 including redistribution-side bonding structures 938 thereupon may be provided, and at least one semiconductor die (700, 800) including a respective set of die-side bonding structures (780, 880) may be provided. The at least one semiconductor die (700, 800) may be bonded to the redistribution structure 920 using first solder material portions 940 that are bonded to a respective redistribution-side bonding structure 938 and to a respective one of the die-side bonding structures (780, 880). Each set of at least one semiconductor die (700, 800) may be attached to a respective redistribution structure 920 through a respective set of first solder material portions 940.

Figure 3C:
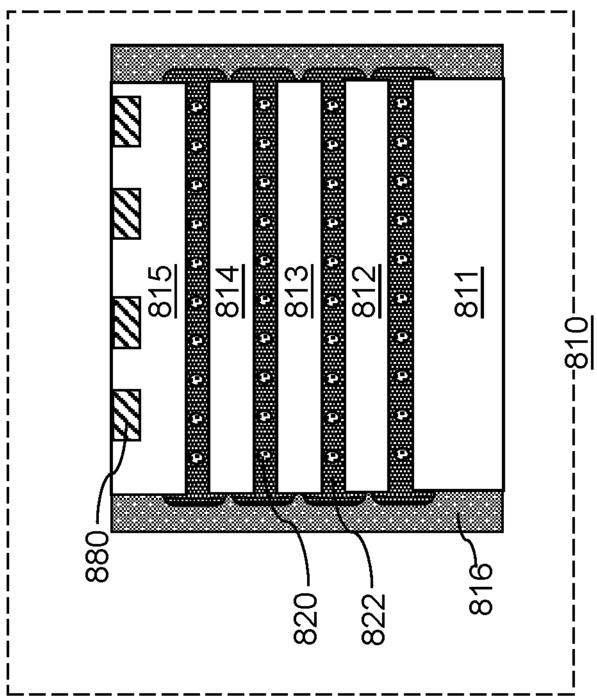
FIG. 3C is a magnified vertical cross-sectional view of a high bandwidth memory die.

Referring to FIG. 3C, a high bandwidth memory (HBM) die 810 is illustrated, which may be used as a memory die 800 within the exemplary structures of FIGS. 3A and 3B. The HBM die 810 may include a vertical stack of static random access memory dies (811, 812, 813, 814, 815) that are interconnected to one another through microbumps 820 and are laterally surrounded by an epoxy molding material enclosure frame 816. The gaps between vertically neighboring pairs of the random access memory dies (811, 812, 813, 814, 815) may be filled with a HBM underfill material portions 822 that laterally surrounds a respective set of microbumps 820. The HBM die 810 may comprise an array of memory-die metal bonding structures 880 configured to be bonded to a subset of an array of redistribution-side bonding structures 938 within a unit area UA. The HBM die 810 may be configured to provide a high bandwidth as defined under JEDEC standards, i.e., standards defined by The JEDEC Solid State Technology Association.

Figure 4:
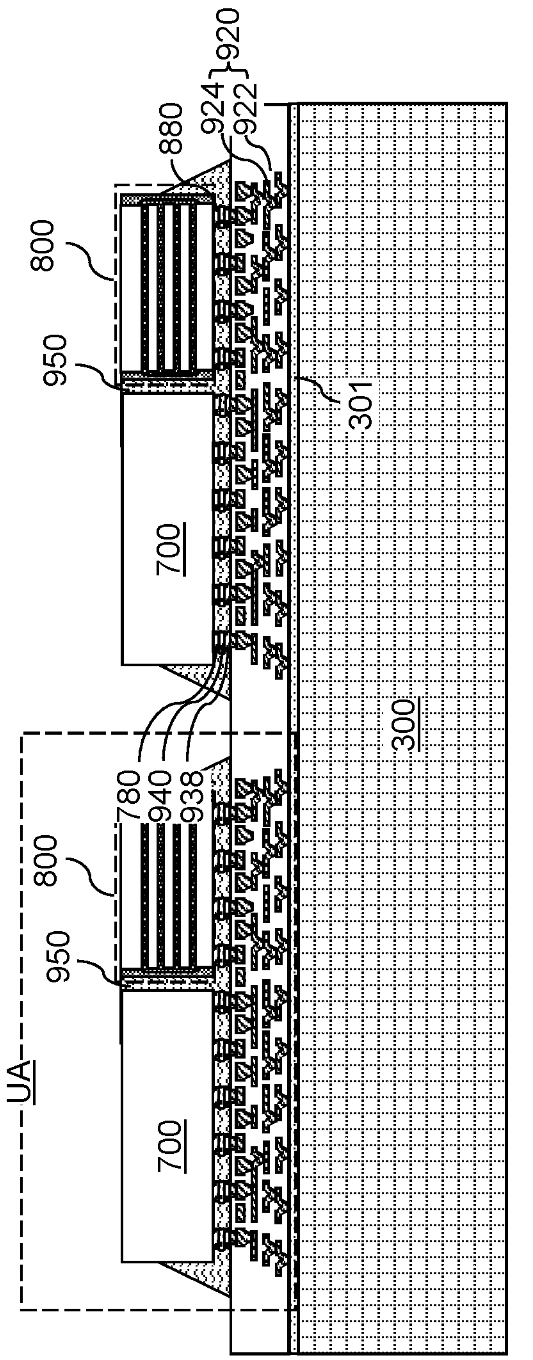
FIG. 4 is a vertical cross-sectional view of a region of the exemplary structure after formation of first underfill material portions.

Referring to FIG. 4, a first underfill material may be applied into each gap between the redistribution structures 920 and sets of at least one semiconductor die (700, 800) that are bonded to the redistribution structures 920. The first underfill material may comprise any underfill material known in the art. A first underfill material portion 950 may be formed within each unit area UA between a redistribution structure 920 and an overlying set of at least one semiconductor die (700, 800). The first underfill material portions 950 may be formed by injecting the first underfill material around a respective array of first solder material portions 940 in a respective unit area UA. Any known underfill material application method may be used, which may be, for example, the capillary underfill method, the molded underfill method, or the printed underfill method.

Within each unit area UA, a first underfill material portion 950 may laterally surround, and contact, each of the first solder material portions 940 within the unit area UA. The first underfill material portion 950 may be formed around, and contact, the first solder material portions 940, the redistribution-side bonding structures 938, and the die-side bonding structures (780, 880) in the unit area UA.

Each redistribution structure 920 in a unit area UA comprises redistribution-side bonding structures 938. At least one semiconductor die (700, 800) comprising a respective set of die-side bonding structures (780, 880) is attached to the redistribution-side bonding structures 938 through a respective set of first solder material portions 940 within each unit area UA. Within each unit area UA, a first underfill material portion 950 laterally surrounds the redistribution-side bonding structures 938 and the die-side bonding structures (780, 880) of the at least one semiconductor die (700, 800).

Figure 5A:
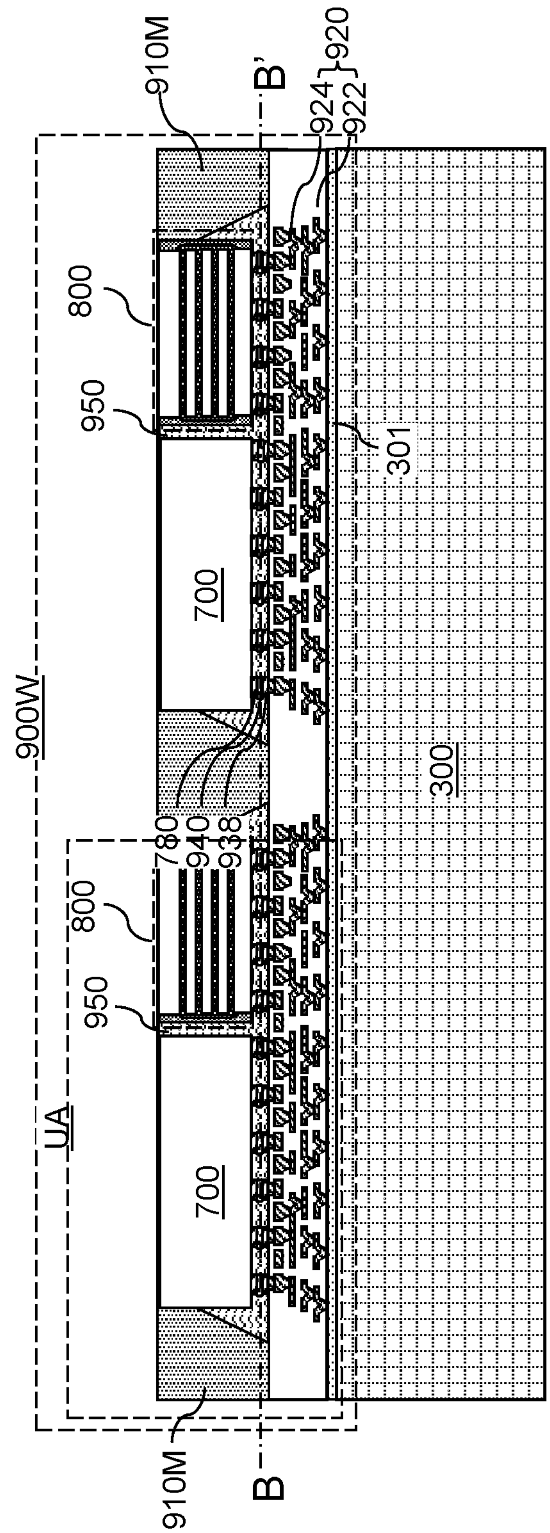
FIG. 5A is a vertical cross-sectional view of a region of the exemplary structure after formation of an epoxy molding compound (EMC) matrix according to an embodiment of the present disclosure.
Figure 5B:
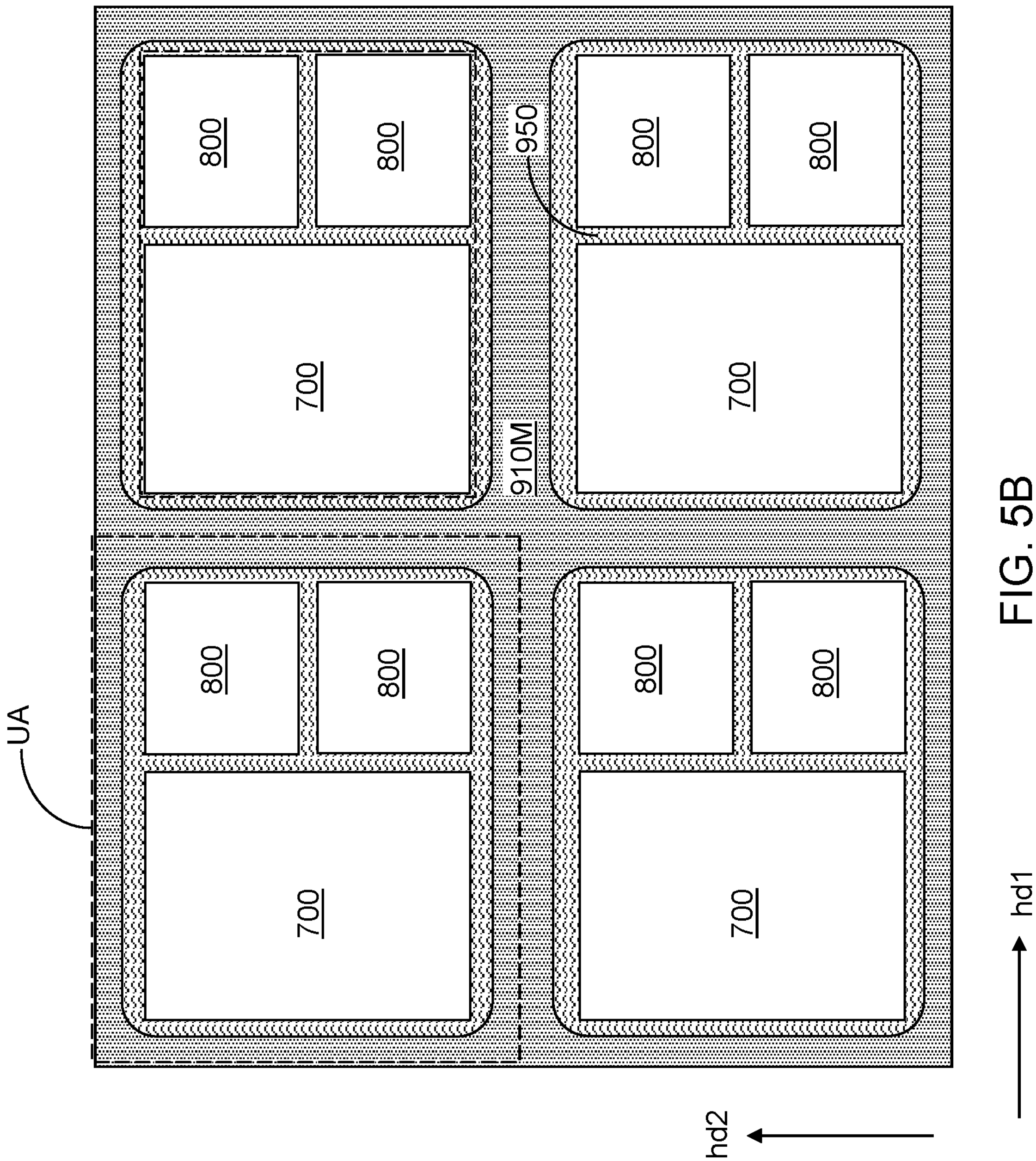
FIG. 5B is a top-down view of the region of the exemplary structure of FIG. 5A.

Referring to FIGS. 5A and 5B, an epoxy molding compound (EMC) may be applied to the gaps between contiguous assemblies of a respective set of semiconductor dies (700, 800) and a first underfill material portion 950. The EMC may include an epoxy-containing compound that may be hardened (i.e., cured) to provide a dielectric material portion having sufficient stiffness and mechanical strength. The curing temperature of the EMC may be lower than the release (debonding) temperature of the first adhesive layer 301 in embodiments in which the adhesive layer includes a thermally debonding material. For example, the curing temperature of the EMC may be in a range from 125° C. to 150° C.

The EMC may be cured at a curing temperature to form an EMC matrix 910M that laterally surrounds and embeds each assembly of a set of semiconductor dies (700, 800) and a first underfill material portion 950. The EMC matrix 910M may include a plurality of epoxy molding compound (EMC) die frames that may be laterally adjoined to one another. Each EMC die frame is a portion of the EMC matrix 910M that is located within a respective unit area UA. Thus, each EMC die frame laterally surrounds and embeds a respective a set of semiconductor dies (700, 800) and a respective first underfill material portion 950. Young's modulus of pure epoxy is about 3.35 GPa, and Young's modulus of the EMC may be higher than Young's modulus of pure epoxy by adding additives. Young's modulus of EMC may be greater than 3.5 GPa.

Portions of the EMC matrix 910M that overlies the horizontal plane including the top surfaces of the semiconductor dies (700, 800) may be removed by a planarization process. In some embodiments in which the top surface of an SoC die 700 is higher than a top surface of a memory die 800, the planarization process may remove both portions of the SoC die 700 and portions of the EMC matrix 910M. For example, the portions of the EMC matrix 910M that overlies the horizontal plane may be removed using a chemical mechanical planarization (CMP). The combination of the remaining portion of the EMC matrix 910M, the semiconductor dies (700, 800), the first underfill material portions 950, and the two-dimensional array of redistribution structures 920 comprises a reconstituted wafer 900W. Each portion of the EMC matrix 910M located within a unit area UA constitutes an EMC die frame.

Figure 6:
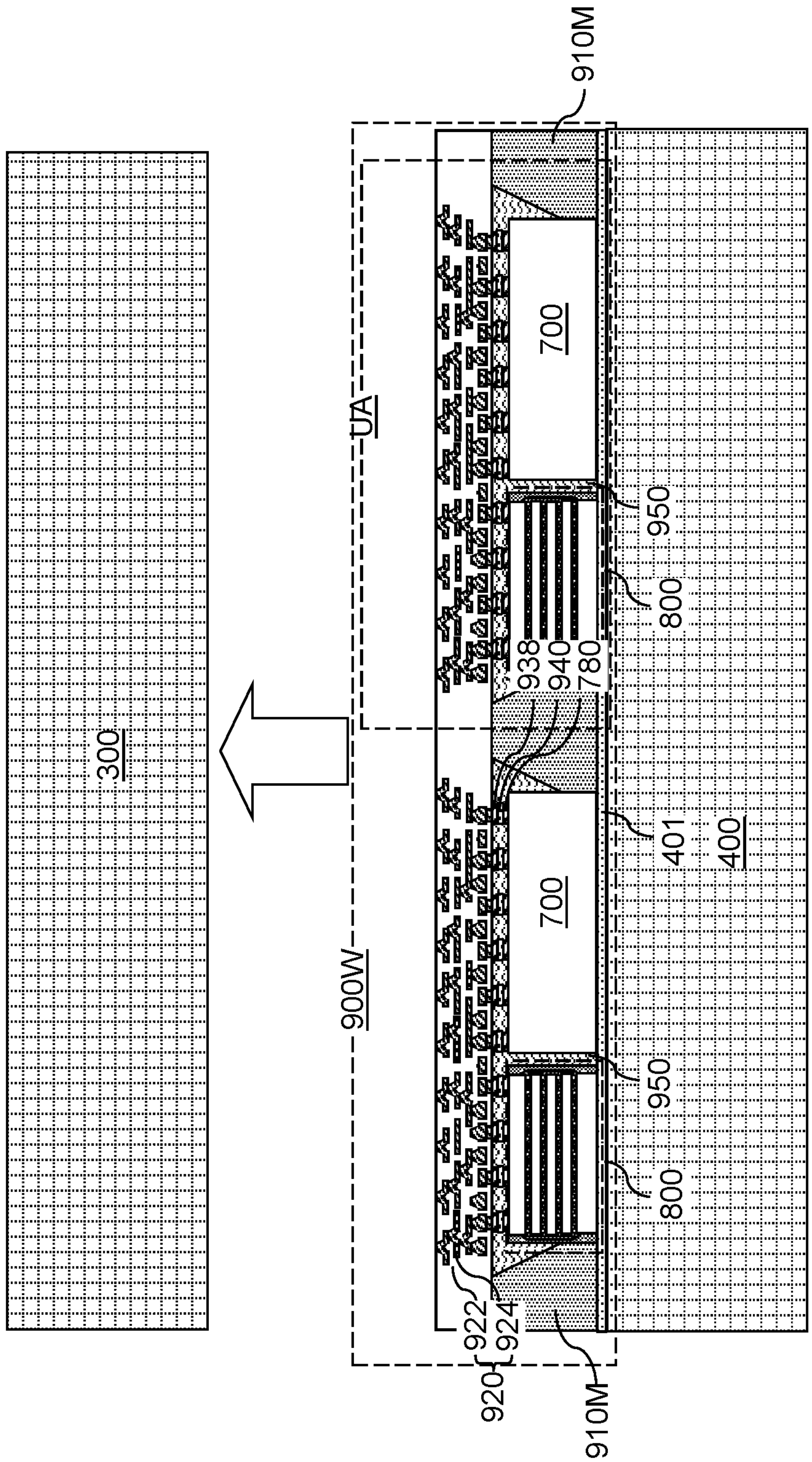
FIG. 6 is a vertical cross-sectional view of a region of the exemplary structure after attaching a second carrier substrate and detaching the first carrier substrate according to an embodiment of the present disclosure.

Referring to FIG. 6, a second adhesive layer 401 may be applied to the physically exposed planar surface of the reconstituted wafer 900W, i.e., the physically exposed surfaces of the EMC matrix 910M, the semiconductor dies (700, 800), and the first underfill material portions 950. A second carrier substrate 400 may be attached to the second adhesive layer 401. The second carrier substrate 400 may be attached to the opposite side of the reconstituted wafer 900W relative to the first carrier substrate 300. Generally, the second carrier substrate 400 may comprise any material that may be used for the first carrier substrate 300. The thickness of the second carrier substrate 400 may be in a range from 500 microns to 2,000 microns, although lesser and greater thicknesses may also be used.

The first adhesive layer 301 may be decomposed by ultraviolet radiation or by a thermal anneal at a debonding temperature. In embodiments in which the first carrier substrate 300 includes an optically transparent material and the first adhesive layer 301 includes an LTHC layer, the first adhesive layer 301 may be decomposed by irradiating ultraviolet light through the transparent carrier substrate. The LTHC layer may absorb the ultraviolet radiation and generate heat, which decomposes the material of the LTHC layer and cause the transparent first carrier substrate 300 to be detached from the reconstituted wafer 900W. In embodiments in which the first adhesive layer 301 includes a thermally decomposing adhesive material, a thermal anneal process at a debonding temperature may be performed to detach the first carrier substrate 300 from the reconstituted wafer 900W.

Figure 7:
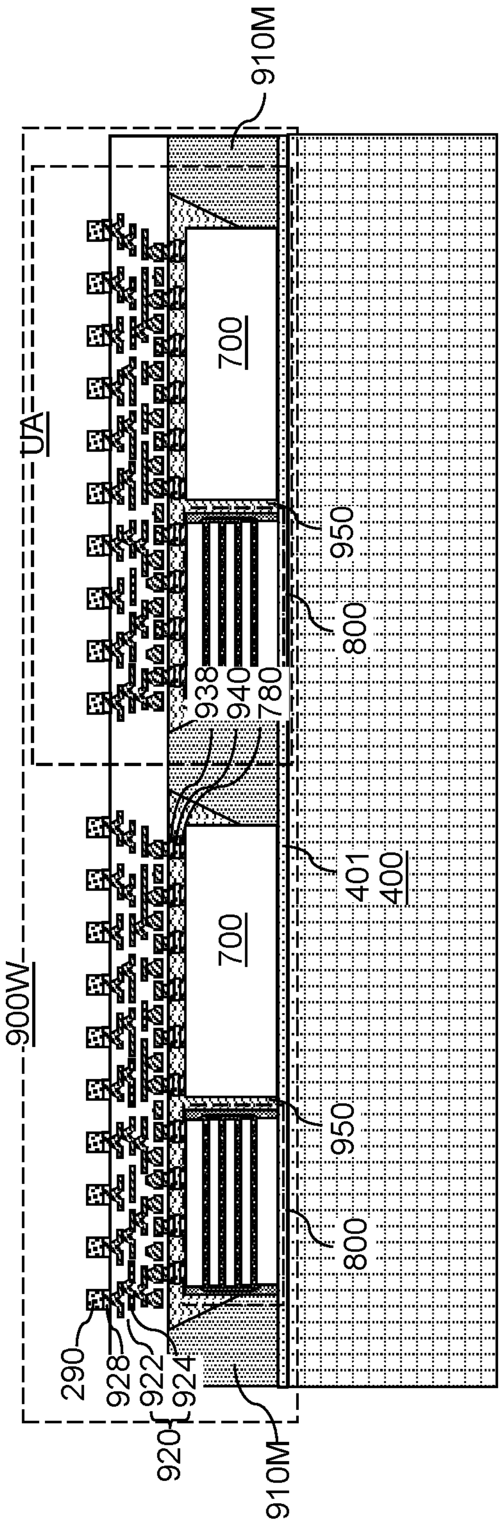
FIG. 7 is a vertical cross-sectional view of a region of the exemplary structure after formation of fan-out bonding pads according to an embodiment of the present disclosure.

Referring to FIG. 7, fan-out bonding pads 928 and second solder material portions 290 may be formed by depositing and patterning a stack of at least one metallic material that may function as metallic bumps and a solder material layer. The metallic fill material for the fan-out bonding pads 928 may include copper. Other suitable metallic fill materials are within the contemplated scope of disclosure. The thickness of the fan-out bonding pads 928 may be in a range from 5 microns to 100 microns, although lesser or greater thicknesses may also be used. The fan-out bonding pads 928 and the second solder material portions 290 may have horizontal cross-sectional shapes of rectangles, rounded rectangles, or circles. Other suitable horizontal cross-sectional shapes are within the contemplated scope of disclosure. In embodiments in which the fan-out bonding pads 928 are formed as C4 (controlled collapse chip connection) pads, the thickness of the fan-out bonding pads 928 may be in a range from 5 microns to 50 microns, although lesser or greater thicknesses may also be used. In some embodiments, the fan-out bonding pads 928 may be, or include, under bump metallurgy (UBM) structures. The configurations of the fan-out bonding pads 928 are not limited to be fan-out structures. Alternatively, the fan-out bonding pads 928 may be configured for microbump bonding (i.e., C2 bonding), and may have a thickness in a range from 30 microns to 100 microns, although lesser or greater thicknesses may also be used. In such an embodiment, the fan-out bonding pads 928 may be formed as an array of microbumps (such as copper pillars) having a lateral dimension in a range from 10 microns to 25 microns, and having a periodic pitch in a range from 20 microns to 50 microns.

The fan-out bonding pads 928 and the second solder material portions 290 may be formed on the opposite side of the EMC matrix 910M and the two-dimensional array of sets of semiconductor dies (700, 800) relative to the redistribution structure layer. The redistribution structure layer includes a three-dimensional array of redistribution structures 920. Each redistribution structure 920 may be located within a respective unit area UA. Each redistribution structure 920 may include redistribution dielectric layers 922, redistribution wiring interconnects 924 embedded in the redistribution dielectric layers 922, and fan-out bonding pads 928. The fan-out bonding pads 928 may be located on an opposite side of the redistribution-side bonding structures 938 relative to the redistribution dielectric layers 922, and may be electrically connected to a respective one of the redistribution-side bonding structures 938.

Figure 8:
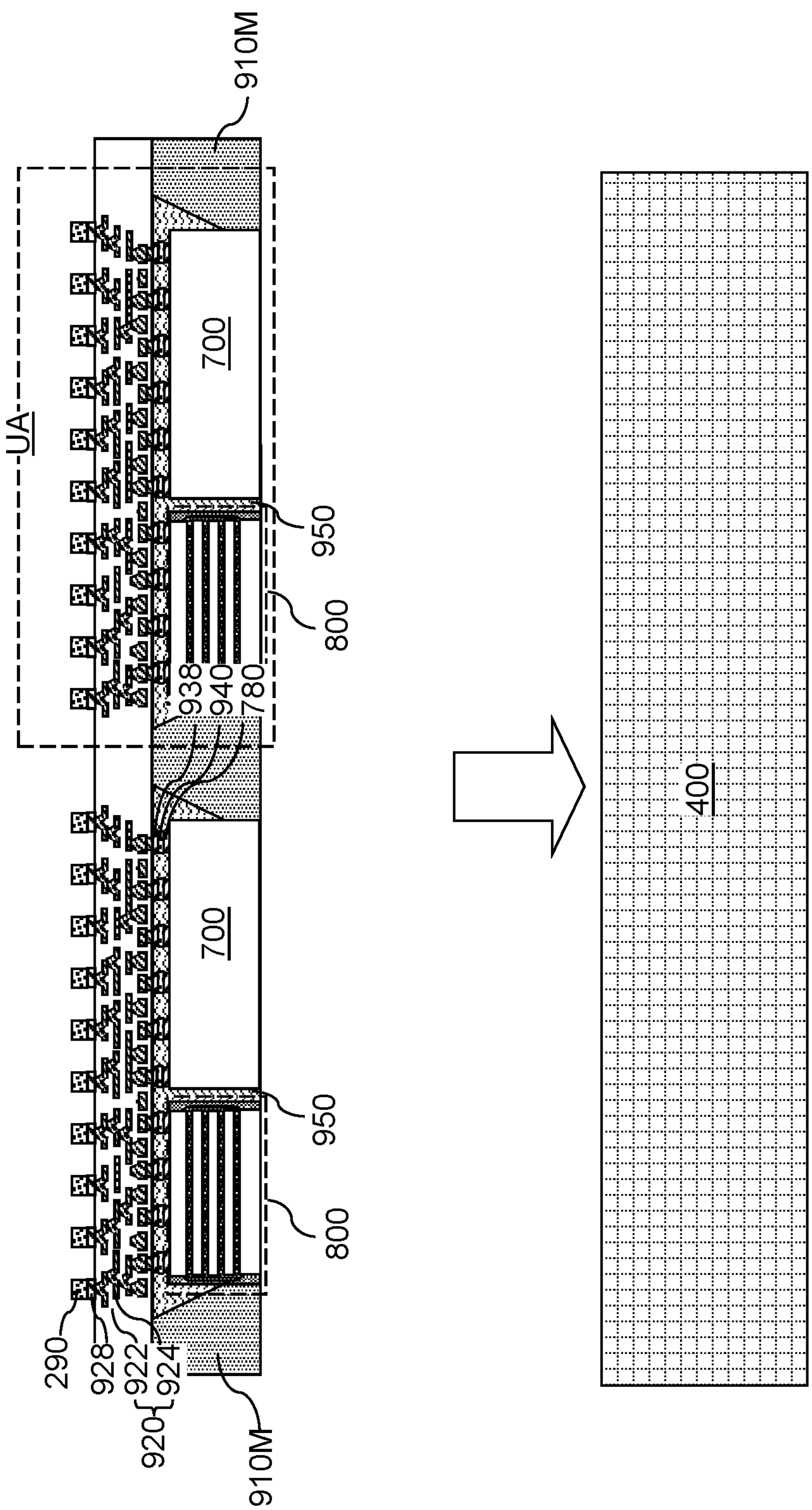
FIG. 8 is a vertical cross-sectional view of a region of the exemplary structure after detaching the second carrier substrate according to an embodiment of the present disclosure.

Referring to FIG. 8, the second adhesive layer 401 may be decomposed by ultraviolet radiation or by a thermal anneal at a debonding temperature. In embodiments in which the second carrier substrate 400 includes an optically transparent material and the second adhesive layer 401 includes an LTHC layer, the second adhesive layer 401 may be decomposed by irradiating ultraviolet light through the transparent carrier substrate. In embodiments in which the second adhesive layer 401 includes a thermally decomposing adhesive material, a thermal anneal process at a debonding temperature may be performed to detach the second carrier substrate 400 from the reconstituted wafer 900W.

Figure 9:
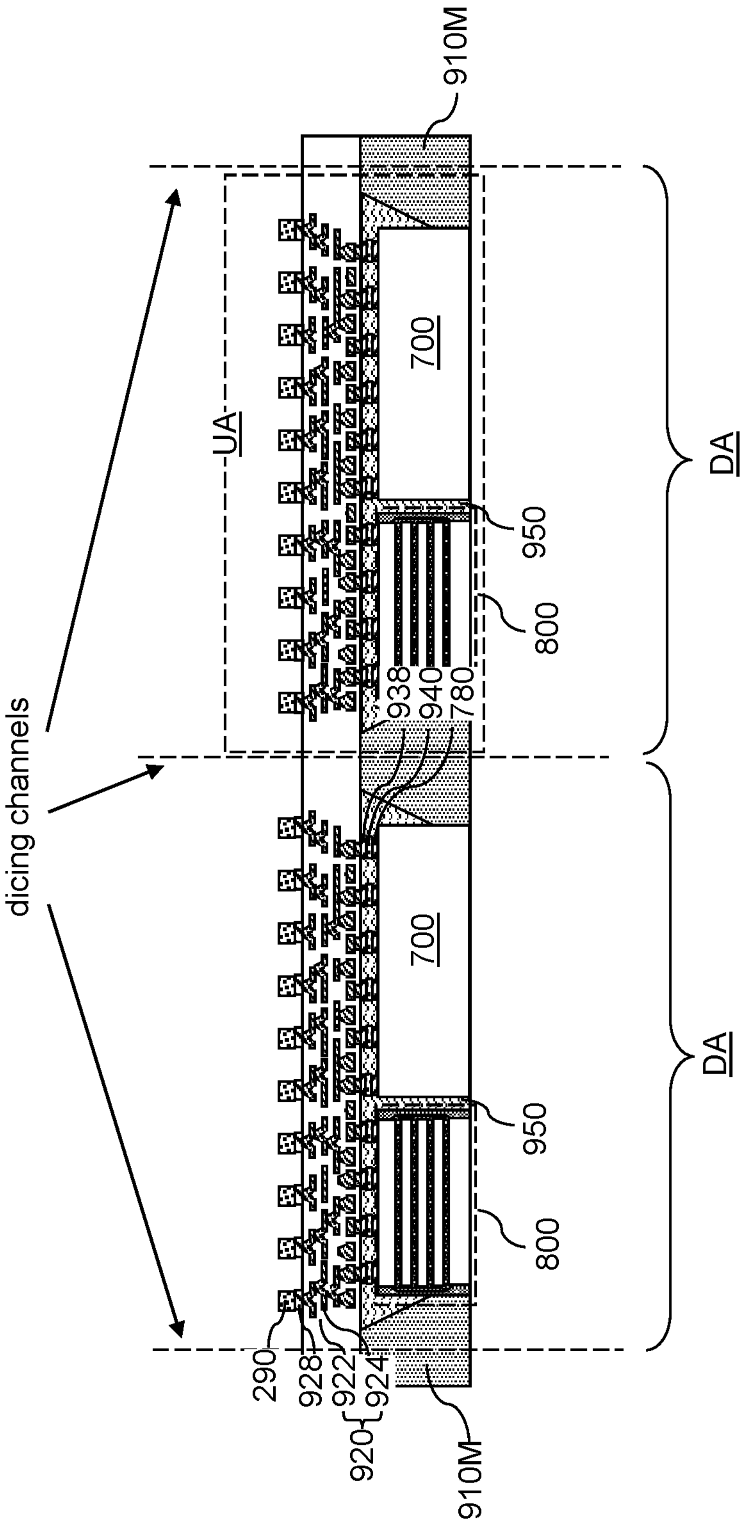
FIG. 9 is a vertical cross-sectional view of a region of the exemplary structure during dicing of a redistribution substrate and the EMC matrix according to an embodiment of the present disclosure.

Referring to FIG. 9, the reconstituted wafer 900W including the fan-out bonding pads 928 may be subsequently diced along dicing channels by performing a dicing process. The dicing channels correspond to the boundaries between neighboring pairs of die areas DA. Each diced unit from the reconstituted wafer 900W may include a fan-out package 900. In other words, each diced portion of the assembly of the two-dimensional array of sets of semiconductor dies (700, 800), the two-dimensional array of first underfill material portions 950, the EMC matrix 910M, and the two-dimensional array of redistribution structures 920 constitutes a fan-out package 900 (see e.g., FIG. 10A). Each diced portion of the EMC matrix 910M constitutes a molding compound die frame 910. Each diced portion of the redistribution structure layer (which includes the two-dimensional array of redistribution structures 920) constitutes a redistribution structure 920.

Figure 10A:
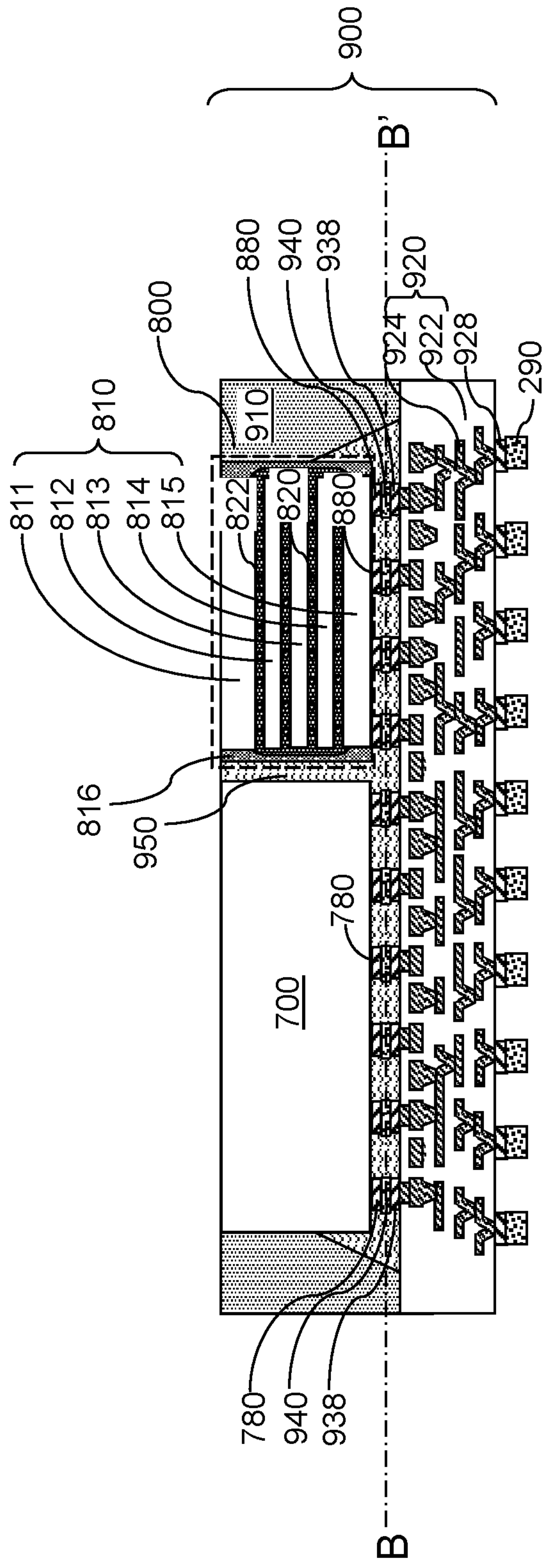
FIG. 10A is a vertical cross-sectional view of a fan-out package according to an embodiment of the present disclosure.
Figure 10B:
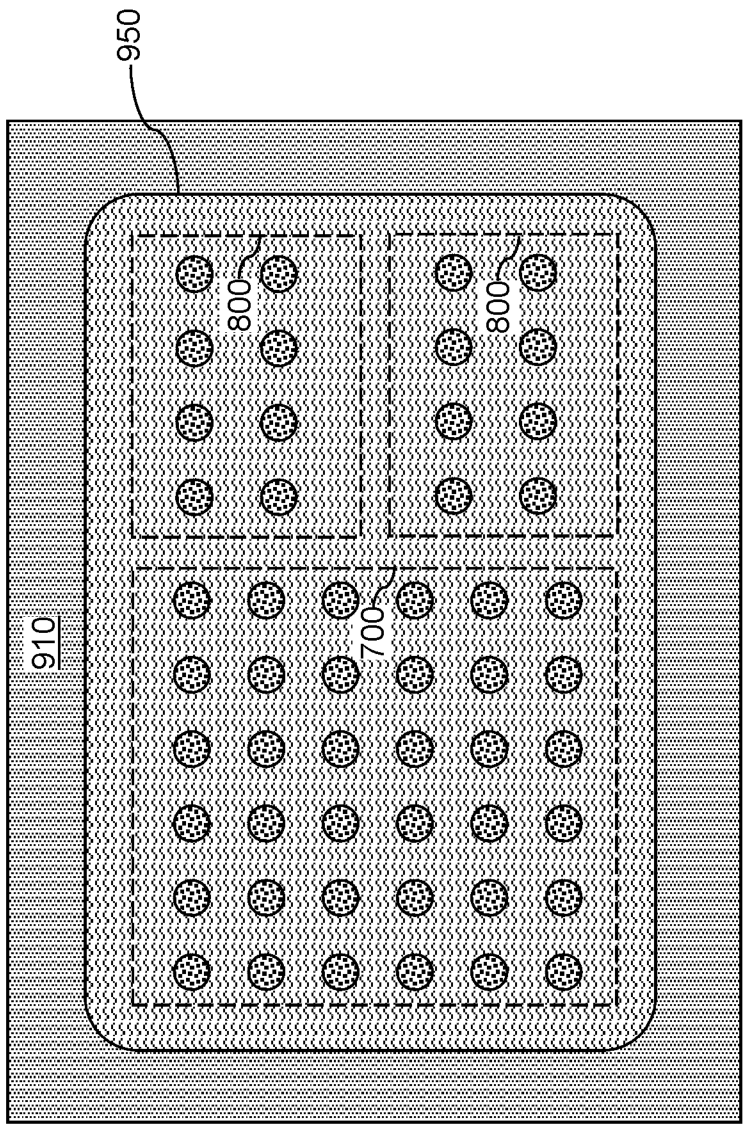
FIG. 10B is a horizontal cross-sectional view of the fan-out package along the horizontal plane B-B' of FIG. 10A.

Referring to FIGS. 10A and 10B, a fan-out package 900 obtained by dicing the exemplary structure at the processing steps of FIG. 9 is illustrated. The fan-out package 900 comprises a redistribution structure 920 including redistribution-side bonding structures 938, at least one semiconductor die (700, 800) comprising a respective set of die-side bonding structures (780, 880) that is attached to the redistribution-side bonding structures 938 through a respective set of first solder material portions 940, a first underfill material portion 950 laterally surrounding the redistribution-side bonding structures 938 and the die-side bonding structures (780, 880) of the at least one semiconductor die (700, 800).

The fan-out package 900 may comprise a molding compound die frame 910 laterally surrounding the at least one semiconductor die (700, 800) and comprising a molding compound material. In one embodiment, the molding compound die frame 910 may include sidewalls that are vertically coincident with sidewalls of the redistribution structure 920, i.e., located within same vertical planes as the sidewalls of the redistribution structure 920. Generally, the molding compound die frame 910 may be formed around the at least one semiconductor die (700, 800) after formation of the first underfill material portion 950 within each fan-out package 900. The molding compound material contacts a peripheral portion of a planar surface of the redistribution structure 920.

Figure 11A:
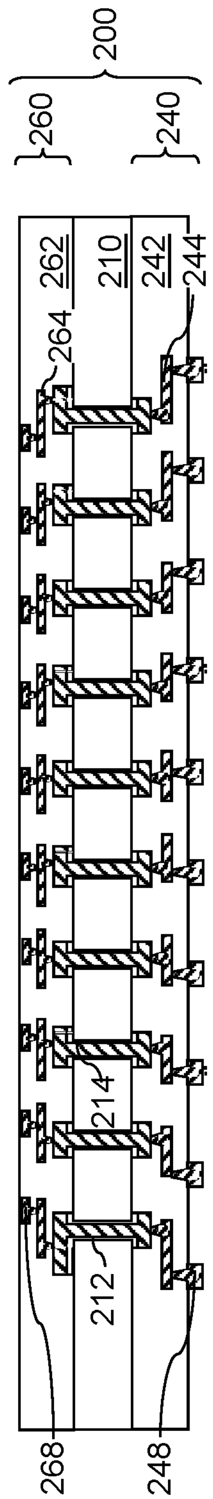
FIG. 11A is a vertical cross-sectional view of a packaging substrate according to an embodiment of the present disclosure.
Figure 11B:
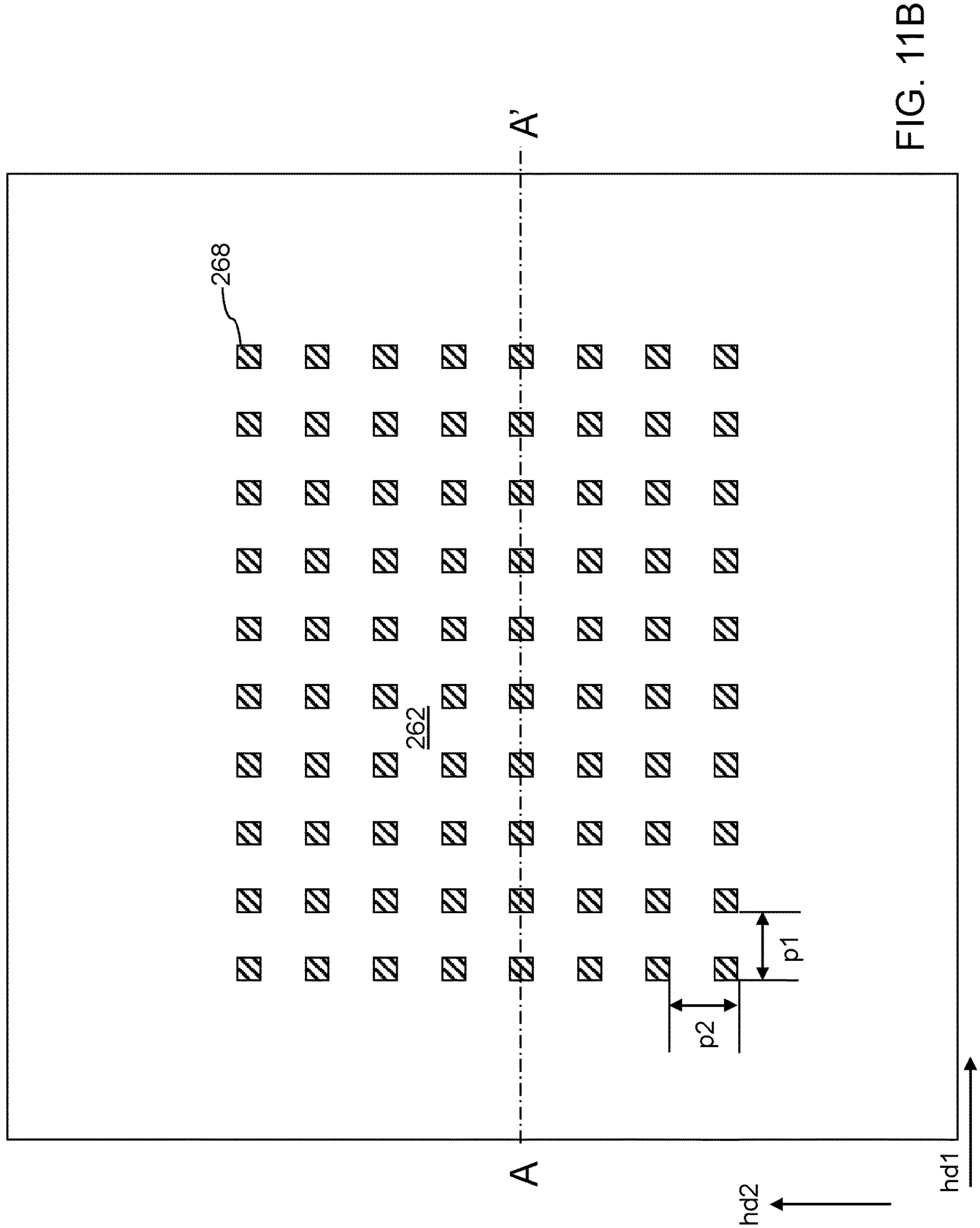
FIG. 11B is a top-down view of the packaging substrate of FIG. 11A. The vertical plane A-A' is the plane of the vertical cross-section of FIG. 11A.

Referring to FIGS. 11A and 11B, a packaging substrate 200 is provided. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers and/or dielectric interlayers, at least one embedded interposer (such as a silicon interposer). Such a system-integrated packaging substrate may include layer-to-layer interconnections using solder material portions, microbumps, underfill material portions (such as molded underfill material portions), and/or an adhesion film. While the present disclosure is described using an exemplary substrate package, it is understood that the scope of the present disclosure is not limited by any particular type of substrate package and may include an SoIS. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the packaging substrate 200 includes a chip-side surface laminar circuit 260 comprising chip-side wiring interconnects 264 connected to an array of chip-side bonding pads 268 that may be bonded to the array of second solder material portions 290, and a board-side surface laminar circuit 240 including board-side wiring interconnects 244 connected to an array of board-side bonding pads 248. The array of board-side bonding pads 248 is configured to allow bonding through solder balls. The array of chip-side bonding pads 268 may be configured to allow bonding through C4 solder balls. Generally, any type of packaging substrate 200 may be used. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

In one embodiment, the array of chip-side bonding pads 268 may be arranged as a two-dimensional periodic array of chip-side bonding pads 268 having a first periodicity along a first horizontal direction hd1 (which is herein referred to as a first periodic pitch p1) and having a second periodicity along a second horizontal direction hd2 (which is herein referred to as a second periodic pitch p2). The first periodic pitch p1 may be the same as the periodicity of the array of second solder material portions 290 along one horizontal direction in the fan-out package 900, and the second periodic pitch p2 may be the same as the periodicity of the array of second solder material portions 290 along another horizontal direction in the fan-out package 900. Generally, the pattern of the chip-side bonding pads 268 may be a mirror image pattern of the pattern of the array of the second solder material portion 290 with optional adjustments in size.

Figure 12A:
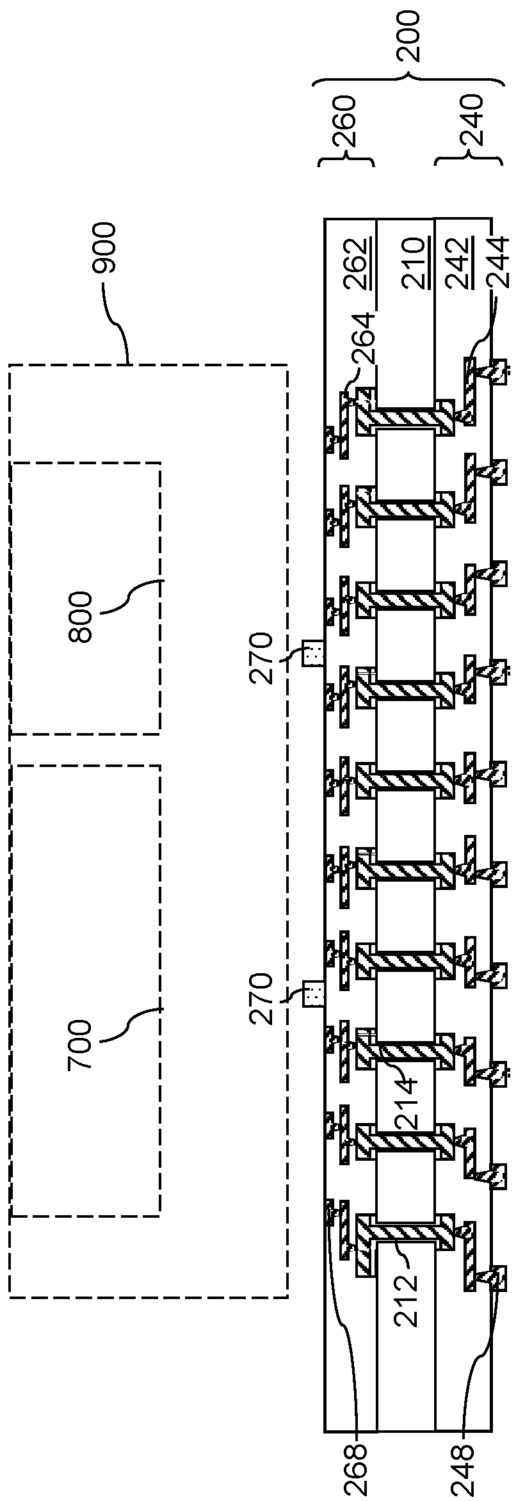
FIG. 12A is a vertical cross-sectional view of the packaging substrate after formation of buffer block structures according to an embodiment of the present disclosure.
Figure 12B:
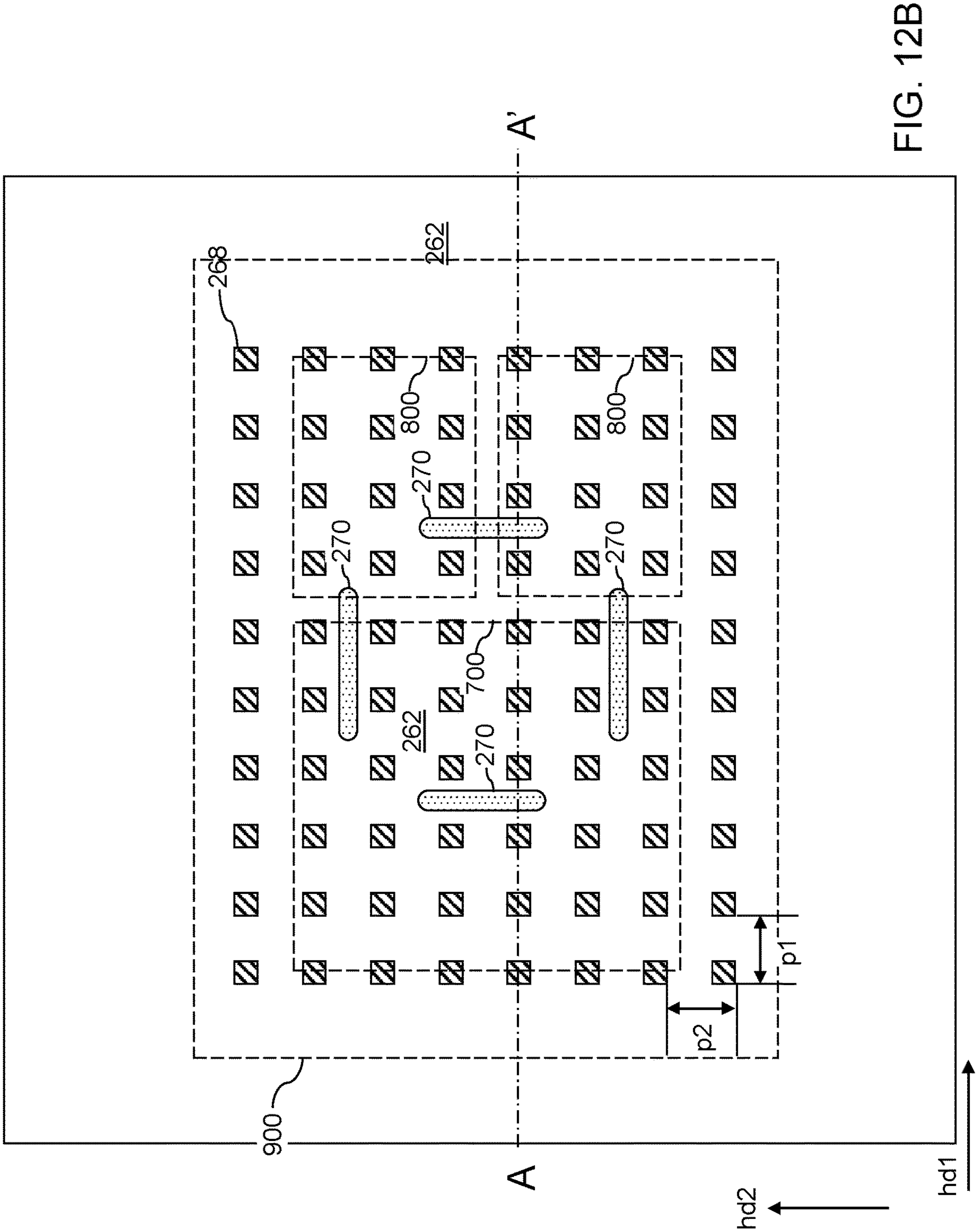
FIG. 12B is a top-down view of the packaging substrate of FIG. 12A. The vertical plane A-A' is the plane of the vertical cross-section of FIG. 12A.

Referring to FIGS. 12A and 12B, buffer block structures 270 may be formed on the chip-side of the packaging substrate 200 including the chip-side bonding pads 268 and the chip-side insulating layers 262. Specifically, a dielectric material may be deposited over the physically exposed horizontal surface of the chip-side insulating layers 262 and over the chip-side bonding pads 268. The Young's modulus of the dielectric material may be greater than the Young's modulus of a second underfill material to be subsequently used. In one embodiment, the deposited dielectric material comprises an inorganic dielectric material or a dielectric polymer material. In one embodiment, the deposited dielectric material may have a Young's modulus greater than 10 GPa, and/or greater than 7 GPa, and/or greater than 4 GPa. In one embodiment, the deposited dielectric material may comprise silicon oxide having a Young's modulus of about 66 GPa or silicon nitride having a Young's modulus of about 166 GPa. Alternatively, the deposited dielectric material may comprise a dielectric metal oxide material such as aluminum oxide or a dielectric transition metal oxide material. Yet alternatively, the deposited dielectric material may comprise a dielectric polymer material having a Young's modulus greater than 10 GPa, and/or greater than 7 GPa, and/or greater than 4 GPa. Non-limiting examples of the dielectric polymer materials having a Young's modulus greater than 10 GPa include glass-filled epoxy resin, mica-filled phenol formaldehyde, and other polymer materials including a strengthening filler material.

A photoresist layer (not shown) may be applied over the deposited dielectric material, and may be lithographically patterned to form discrete photoresist material portions covering areas that do not overlap with the chip-side bonding pads 268 and located entirely within the area of a fan-out package 900 (to be subsequently used) in a bonding position in a plan view (such as the view of FIG. 12B) along a vertical direction. The vertical direction is the direction that is perpendicular to the physically exposed horizontal surface of the chip-side insulating layers 262. The location of the fan-out package 900 in the bonding position is represented by dotted lines in FIGS. 12A and 12B.

The pattern in the discrete photoresist material portions may be transferred through the deposited dielectric material by performing an etch process, which may comprise an anisotropic etch process or an isotropic etch process. Each remaining patterned portions of the deposited dielectric material is herein referred to as a buffer block structure 270. Generally, at least one buffer block structure 270 may be formed over a horizontal surface of the packaging substrate 200. For example, the at least one buffer block structure 270 may be formed directly on a horizontal top surface of the chip-side insulating layers 262 in a manner that does not contact any of the chip-side bonding pads 268.

According to an aspect of the present disclosure, each of the at least one buffer block structure 270 may be formed on the packaging substrate 200 between a respective neighboring pair of chip-side bonding pads 268 selected from the chip-side bonding pads 268. In one embodiment, each of the at least one buffer block structure 270 may have a minimum width between a parallel pair of sidewall segments having parallel vertical tangential planes (i.e., vertical planes that tangentially touch the sidewall segments of a respective buffer block structure 270 and are parallel to each other). The minimum width is less than the lateral spacing between a respective neighboring pair of chip-side bonding pads 268. Each of the at least one buffer block structure 270 may be located within an area of a fan-out package 900 to be subsequently attached to the packaging substrate 200 in a plan view. The plan view is a view along a vertical direction, which is the direction that is perpendicular to the horizontal plane including a top surface of the packaging substrate 200 that contains the physically exposed horizontal surface of the chip-side insulating layers 262.

In one embodiment, each of the at least one buffer block structure 270 may have at least one vertical sidewall. In one embodiment, one, a plurality, and/or each, of the at least one buffer block structure 270 may have a respective a horizontal cross-sectional shape that is consistent under translation along a vertical direction that is perpendicular to a horizontal plane including the top surface of the packaging substrate 200. In one embodiment, each of the at least one buffer block structure 270 has a horizontal cross-sectional shape of a rectangle, a rounded rectangle, a circle, or an ellipse, or any other two-dimensional shape having a closed periphery. Each of the at least one buffer block structure 270 comprises an inorganic dielectric material or a dielectric polymer material.

In one embodiment, the chip-side bonding pads 268 may be arranged as a two-dimensional array having a first periodic pitch p1 along a first horizontal direction; and one of the at least one buffer block structure 270 may have a respective length along the first horizontal direction hd1 that is greater than a width along the second horizontal direction hd2 (which is perpendicular to the first horizontal direction hd1. In one embodiment, the length of the one of the at least one buffer block structure 270 along the first horizontal direction hd1 is greater than the first periodic pitch p1 as illustrated in FIG. 12B.

The width of each buffer block structure 270 is generally less than the spacing between a proximal neighboring pair of chip-side bonding pads 268. For example, the width each buffer block structure 270 may be in a range from 10 microns to 1 mm depending on the first periodic pitch p1 and the second periodic pitch p2 of the two-dimensional array of chip-side bonding pads 268, although lesser and greater widths may also be used. The length of each buffer block structure 270 may be in a range from 10 microns to 1 mm, although lesser and greater lengths may also be used. The length-to-width ratio of each buffer block structure 270 may be in a range from 1 to 100, although a greater length-to-width ratio may also be used. The height of each buffer block structure 270 is not greater than, and may be the same as, or may be less than, the separation distance between the packaging substrate 200 and a fan-out package 900 that is subsequently bonded to the packaging substrate 200. In an illustrative example, the height of each buffer block structure 270 may be in a range from 30 microns to 150 microns, although lesser and greater ratios may also be used. The ratio of the height of each buffer block structure 270 to the separation distance between the packaging substrate 200 and the fan-out package 900 to be subsequently bonded may be in a range from 0.40 to 1.0, although a lesser ratio may also be used.

Each of the at least one buffer block structure 270 has a respective horizontal cross-sectional shape, which may be a shape of a rectangle, a rounded rectangle, a circle, an ellipse, or a generally curvilinear two-dimensional shape having a closed periphery.

Figure 12C:
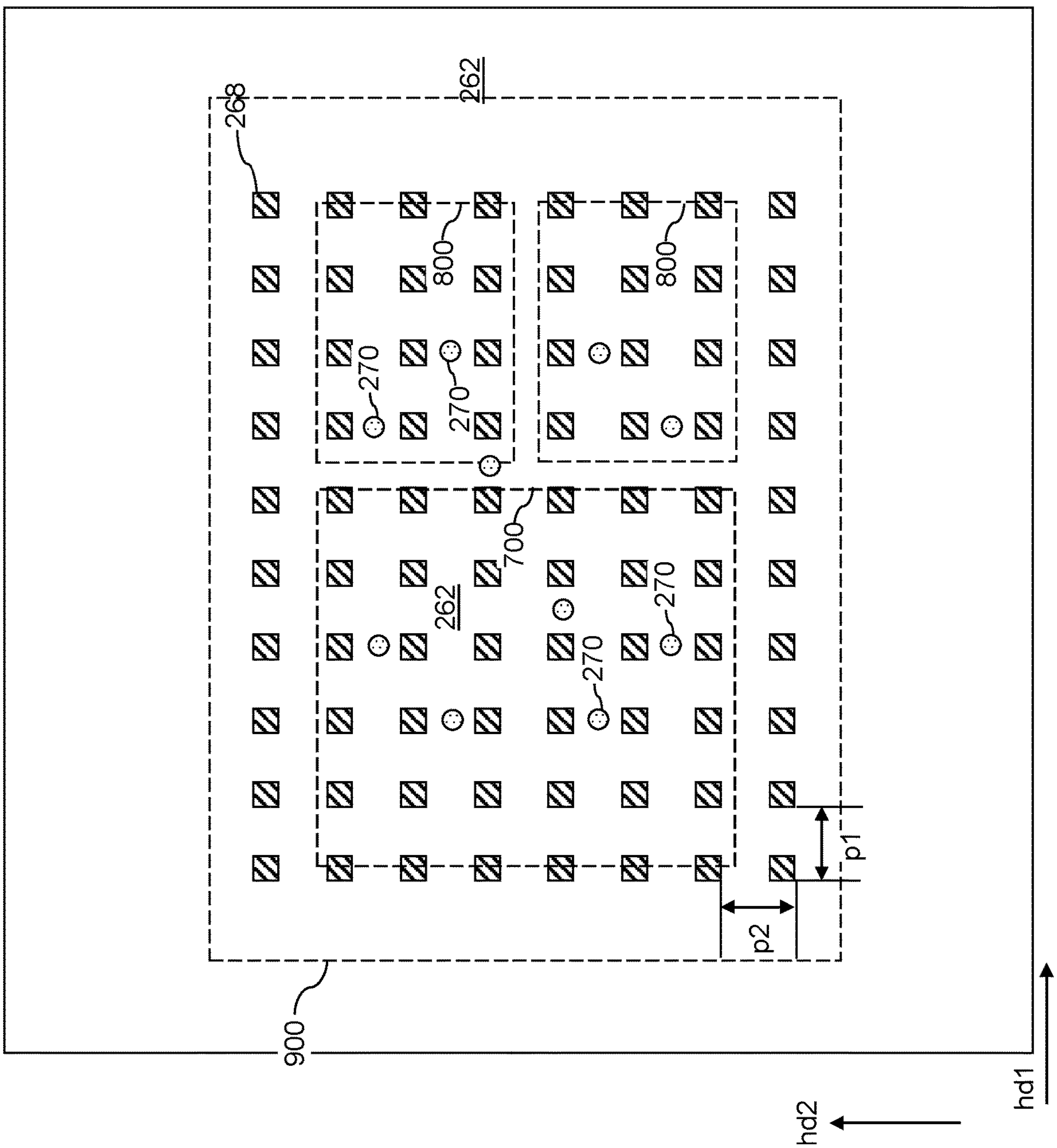
FIG. 12C is a top-down view of a first alternative configuration of the packaging substrate at the processing steps of FIGS. 12A and 12B according to an embodiment of the present disclosure.

Referring to FIG. 12C, a top-down view of a first alternative configuration of the packaging substrate 200 is shown at the processing steps of FIGS. 12A and 12B. The chip-side bonding pads 268 may be arranged as a two-dimensional array having the first periodic pitch p1 along the first horizontal direction hd1 and having the second periodic pitch p2 along the second horizontal direction hd2. In the illustrated first alternative configuration, one, a plurality, or each, of the at least one buffer block structure 270 may have a maximum dimension that is less than the first periodic pitch p1 and is less than the second periodic pitch p2. In one embodiment, one, a plurality, or each, of the at least one buffer block structure 270 may have a maximum dimension that is less than the lateral spacing between neighboring pairs of chip-side bonding pads 268 along the first horizontal direction hd1, and is less than the lateral spacing between neighboring pairs of chip-side bonding pads 268 along the second horizontal direction hd2. In one embodiment, the buffer block structures 270 may have a respective circular horizontal cross-sectional shape. Other horizontal cross-sectional shapes are within the contemplated scope of disclosure.

In one embodiment, the buffer block structures 270 may be located at each location, or at a subset of locations, between neighboring pairs chip-side bonding pads 268 that are laterally spaced apart along the first horizontal direction hd1 within an area that corresponds to the area of a fan-out package 900 to be subsequently bonded. Alternatively or additionally, the buffer block structures 270 may be located at each location, or at a subset of locations, between neighboring pairs chip-side bonding pads 268 that are laterally spaced apart along the second horizontal direction hd2 within the area that corresponds to the area of a fan-out package 900 to be subsequently bonded. In the illustrated configuration of FIG. 12C, the buffer block structures 270 may be formed at a subset that is less than the entirety of the locations between neighboring pairs of chip-side bonding pads.

In some embodiments, the chip-side bonding pads 268 may be arranged as a two-dimensional array having the first periodic pitch p1 along the first horizontal direction hd1 and having the second periodic pitch p2 along the second horizontal direction hd2. In some embodiment, the at least one buffer block structure 270 comprises a two-dimensional array of buffer blocking structures 270 having the first periodic pitch p1 along the first horizontal direction hd1 and having the second periodic pitch p2 along the second horizontal direction hd2, for example, as illustrated in FIGS. 12D and 12E.

Figure 12D:
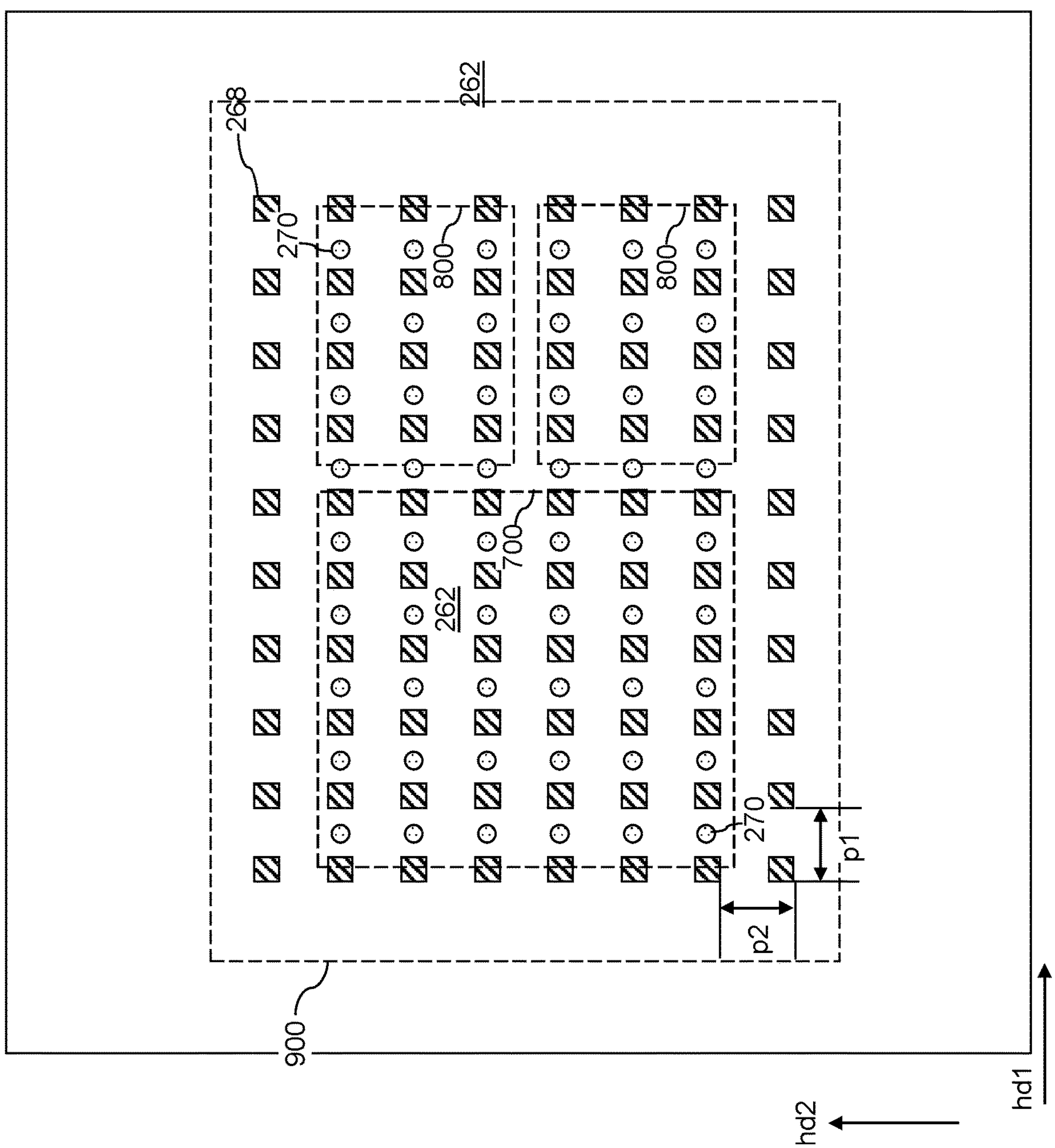
FIG. 12D is a top-down view of a second alternative configuration of the packaging substrate at the processing steps of FIGS. 12A and 12B according to an embodiment of the present disclosure.

FIG. 12D is a top-down view of a second alternative configuration of the packaging substrate at the processing steps of FIGS. 12A and 12B according to an embodiment of the present disclosure. In the second alternative configuration, the buffer block structures 270 may be located at each location between neighboring pairs chip-side bonding pads 268 that are laterally spaced apart along the first horizontal direction hd1 within an area that corresponds to the area of a fan-out package 900 to be subsequently bonded.

Figure 12E:
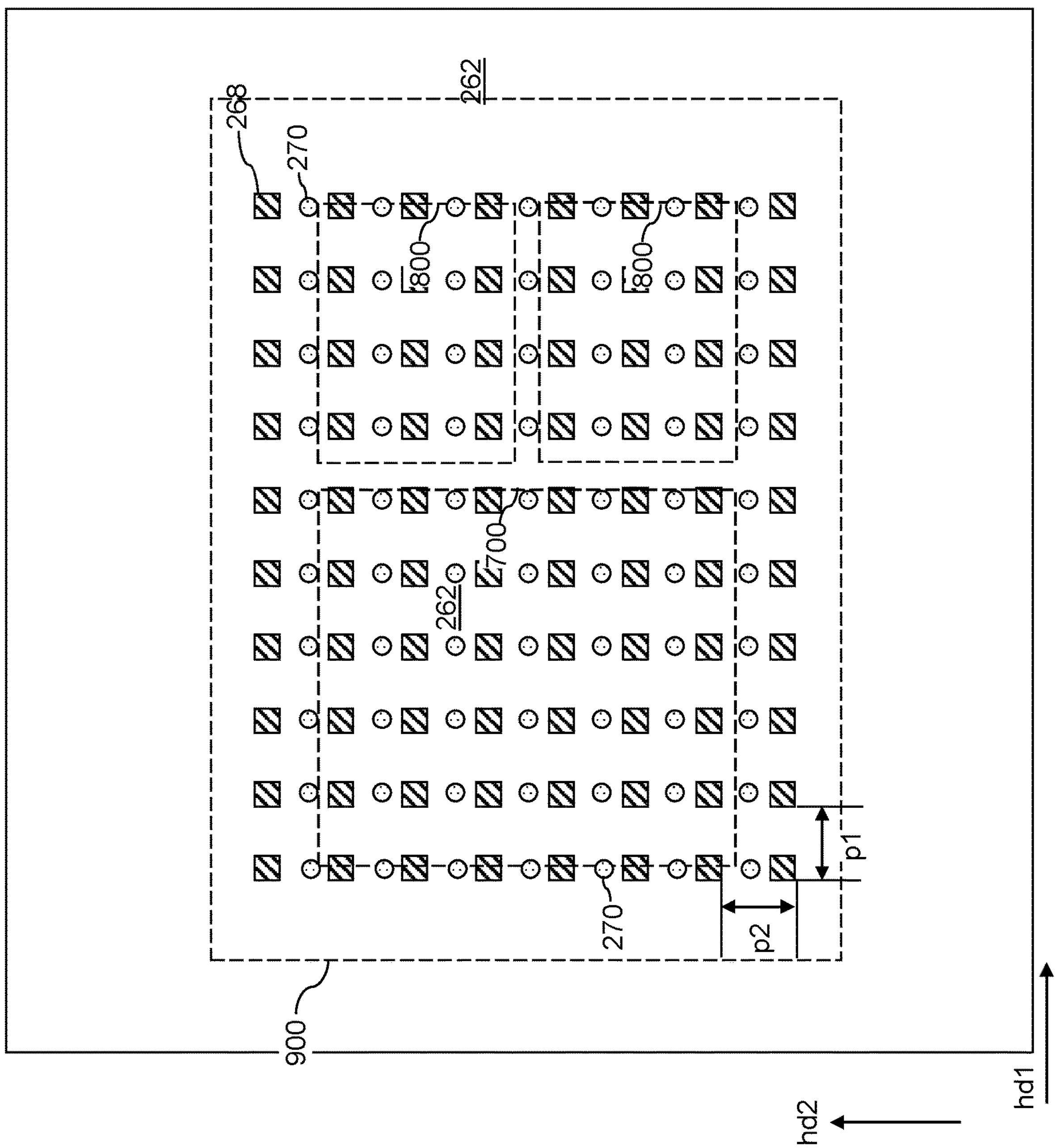
FIG. 12E is a top-down view of a third alternative configuration of the packaging substrate at the processing steps of FIGS. 12A and 12B according to an embodiment of the present disclosure.

FIG. 12E is a top-down view of a third alternative configuration of the packaging substrate at the processing steps of FIGS. 12A and 12B according to an embodiment of the present disclosure. In the third alternative configuration, the buffer block structures 270 may be located at each location between neighboring pairs chip-side bonding pads 268 that are laterally spaced apart along the second horizontal direction hd1 within an area that corresponds to the area of a fan-out package 900 to be subsequently bonded.

Figure 13:
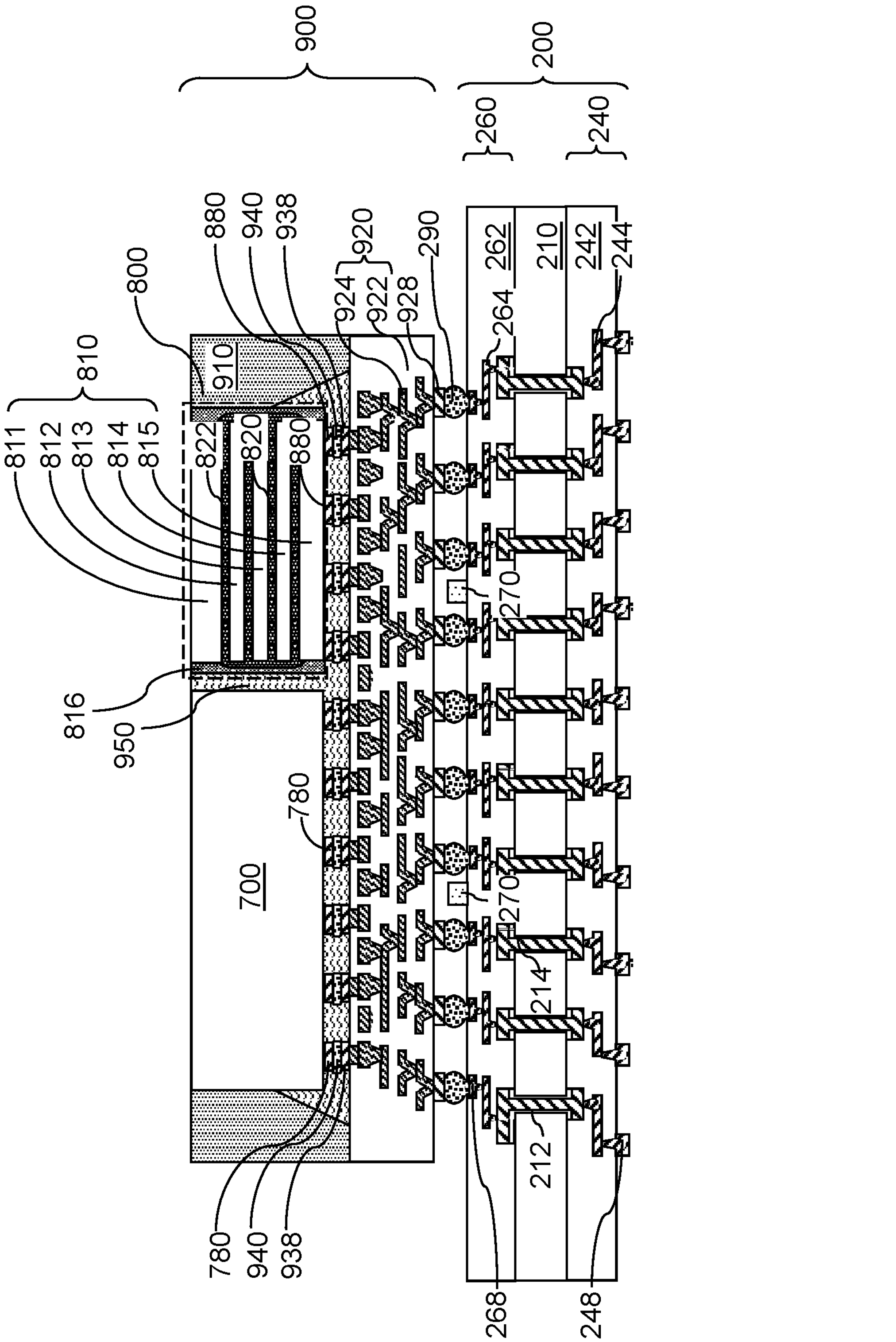
FIG. 13 is a vertical cross-sectional view of an exemplary structure after attaching the fan-out package to the packaging substrate according to an embodiment of the present disclosure.

Referring to FIG. 13, the fan-out package 900 may be disposed over the packaging substrate 200 with an array of the second solder material portions 290 therebetween. In embodiments in which the second solder material portions 290 are formed on the fan-out bonding pads 928 of the fan-out package 900, the second solder material portions 290 may be disposed on the chip-side bonding pads 268 of the packaging substrate 200. A reflow process may be performed to reflow the second solder material portions 290, thereby inducing bonding between the fan-out package 900 and the packaging substrate 200. Each second solder material portion 290 may be bonded to a respective one of the fan-out bonding pads 928 and to a respective one of the chip-side bonding pads 268. In one embodiment, the second solder material portions 290 may include C4 solder balls, and the fan-out package 900 may be attached to the packaging substrate 200 through an array of C4 solder balls. Generally, the fan-out package 900 may be bonded to the packaging substrate 200 such that the redistribution structure 920 is bonded to the packaging substrate 200 by an array of solder material portions (such as the second solder material portions 290). The at least one buffer block structure 270 may, or may not, contact a bottom surface of the fan-out package 900 (i.e., a bottom horizontal surface of the redistribution structure 920).

Generally, the fan-out package 900 may be bonded to the packaging substrate 200 such that the redistribution structure 920 is bonded to the packaging substrate 200 by an array of the second solder material portions 290. Each of the at least one buffer block structure 270 may be positioned between a respective neighboring pair of second solder material portions 290 selected from the array of second solder material portions 290. Each of the at least one buffer block structure 270 may, or may not, contact one, or two, neighboring ones of the second solder material portions 290.

Each of the at least one buffer block structure 270 may be positioned within a projection area of the fan-out package 900 in a plan view along a vertical direction that is perpendicular to horizontal surfaces of the fan-out package 900 and the packaging substrate 200 that face each other upon bonding the fan-out package 900 to the packaging substrate 200. One, a plurality, and/or each, of the at least one buffer block structure 270 may have a uniform height that is equal to, or is less than, the vertical spacing between a horizontal plane of the redistribution structure 922 and a horizontal plane including a horizontal plane of the packaging substrate 200, i.e., the spacing between facing horizontal surfaces of the fan-out package 900 and the packaging substrate 200. In embodiments in which the height of each buffer block structure 270 is less than the spacing between the facing horizontal surfaces of the fan-out package 900 and the packaging substrate 200, each buffer block structure 290 contacts a horizontal surface of the packaging substrate 200 and does not contact the fan-out package 900.

Figure 14A:
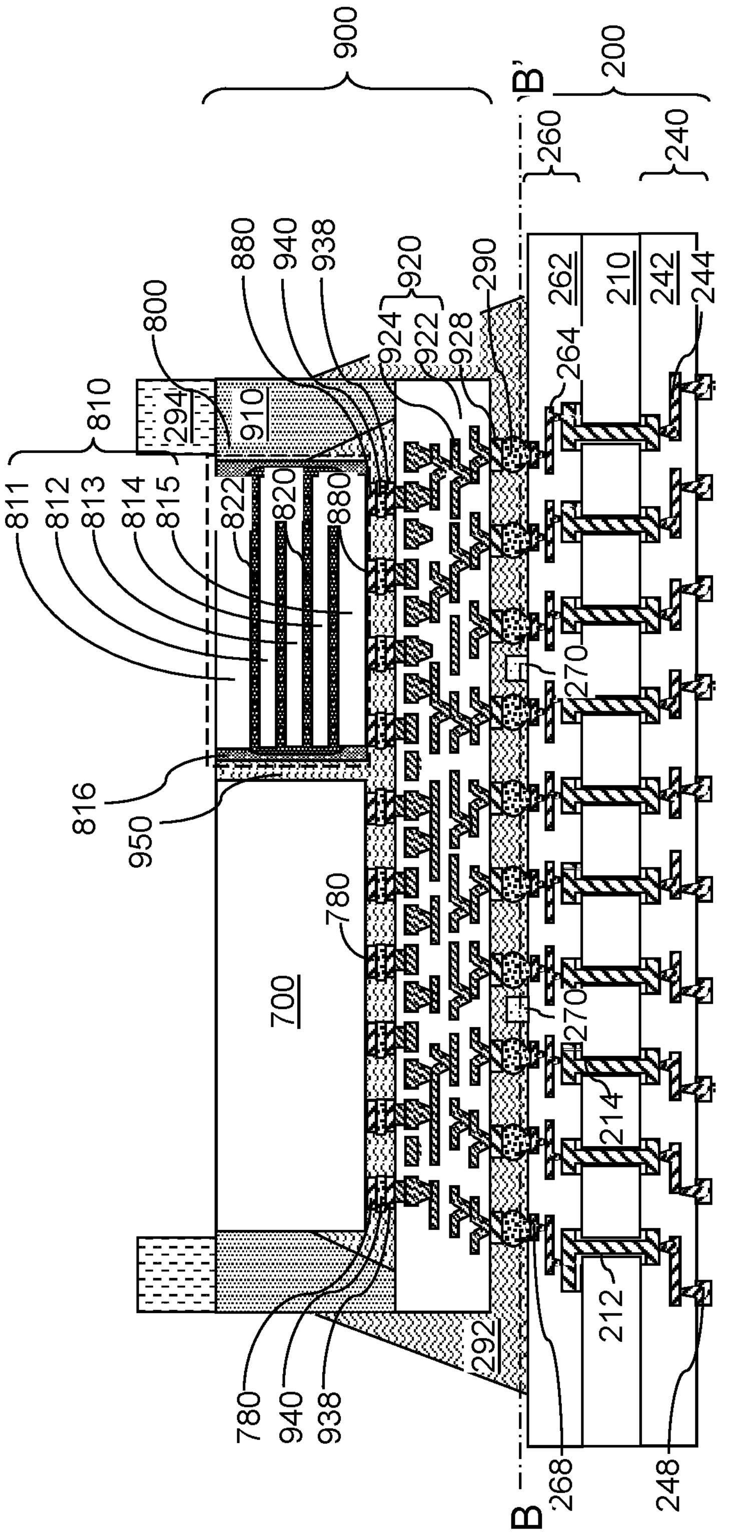
FIG. 14A is a vertical cross-sectional view of the exemplary structure after formation of a second underfill material portion according to an embodiment of the present disclosure.
Figure 14B:
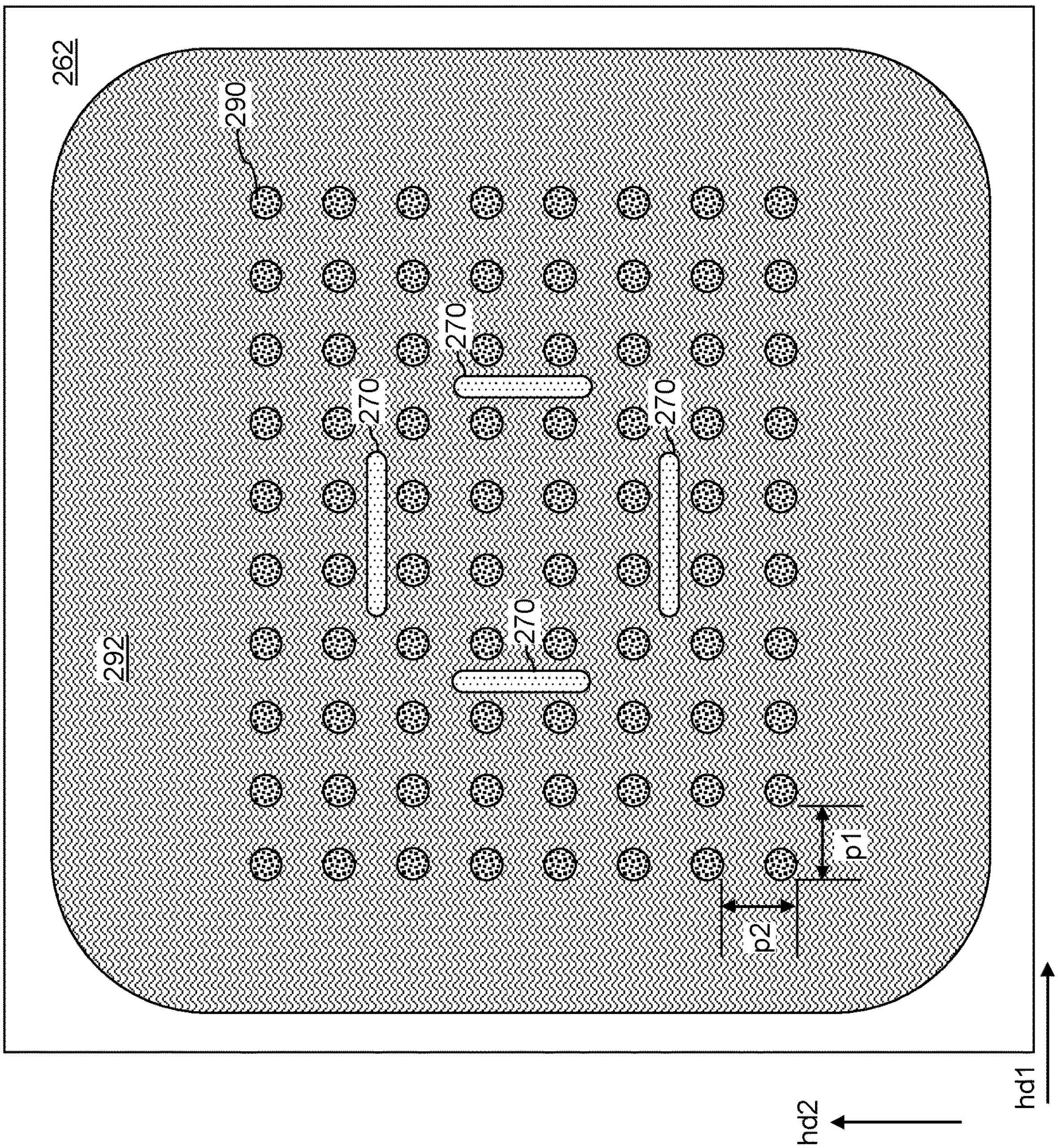
FIG. 14B is a horizontal cross-sectional view of the exemplary structure along the horizontal plane B-B' of FIG. 14A. The vertical plane A-A' is the plane of the vertical cross-section of FIG. 14A.

Referring to FIGS. 14A and 14B, a second underfill material portion 292 may be formed around the second solder material portions 290 and the at least one buffer block structure 270 by applying and shaping a second underfill material. The second underfill material portion 292 may be formed by injecting the second underfill material around the array of second solder material portions 290 after the second solder material portions 290 are reflowed. Any known underfill material application method may be used, which may be, for example, the capillary underfill method, the molded underfill method, or the printed underfill method.

The second underfill material portion 292 may be formed between the redistribution structure 920 and the packaging substrate 200. According to an aspect of the present disclosure, the second underfill material portion 292 may be formed directly on each sidewall of the molding compound die frame 910 and directly on each of the at least one buffer block structure 270. The second underfill material portion 292 may contact each of the second solder material portions 290 (which may be C4 solder balls or C2 solder caps), and may contact vertical sidewalls of the fan-out package 900. The second underfill material portion laterally surrounds, and contacts, the array of second solder material portions 290, the at least one buffer block structure 270, and the fan-out package 900.

Optionally, a stabilization structure 294, such as a cap structure or a ring structure, may be attached to the assembly of the fan-out package 900 and the packaging substrate 200 to reduce deformation of the assembly during subsequent processing steps and/or during usage of the assembly.

In one embodiment, the fan-out package 900 comprises a molding compound die frame 910 that laterally surrounds the at least one semiconductor die (700, 800) and contacting a peripheral portion of a top surface of the redistribution structure 920. The second underfill material portion 292 may be formed directly on sidewalls of the molding compound die frame 910. In one embodiment, the second underfill material portion 292 laterally surrounds each of the at least one buffer block structure 270. Each of the at least one buffer block structure 270 may be located between a respective neighboring pair of second solder material portions 290 within the array of second solder material portions 290 and between the fan-out package 900 and the packaging substrate 200, and may be laterally surrounded by, and contacted by, the second underfill material portion 292.

In one embodiment, the at least one buffer block structure 270 may include a material having a Young's modulus that is greater than a Young's modulus of the second underfill material portion 292. The at least one buffer block structure 270 prevents, and/or reduces, structural deformation of the bonded assembly during application of the second underfill material portion 292. In one embodiment, the second underfill material portion 292 contacts sidewalls of the redistribution structure 920 and sidewalls of the molding compound die frame 910. In one embodiment, each of the at least one buffer block structure 270 may be located within a projection area of the fan-out package 900 in a plan view along a vertical direction that is perpendicular to a horizontal plane including a surface of the packaging substrate 200 that contacts the second underfill material portion 292.

In one embodiment, one, a plurality, and/or each, of the at least one buffer block structure 270 may have a respective horizontal cross-sectional shape that is consistent along a vertical direction that is perpendicular to a horizontal plane including a surface of the packaging substrate 200 that contacts the second underfill material portion 292. The at least one buffer block structure 270 comprises, and/or consists essentially of, an inorganic dielectric material or a dielectric polymer material.

In one embodiment, the chip-side bonding pads 268 may be arranged as a two-dimensional array having the first periodic pitch p1 along the first horizontal direction hd1 and having the second periodic pitch p2 along the second horizontal direction hd2. One of the at least one buffer block structure 270 may have a length along the first horizontal direction hd1 that is greater than a width along the second horizontal direction hd2 that is perpendicular to the first horizontal direction hd1. The length of the one of the at least one buffer block structure 270 along the first horizontal direction hd1 may be greater than the first periodic pitch p1. Another of the at least one buffer block structure 270 may have a length along the second horizontal direction hd2 that is greater than a width along the first horizontal direction hd1. The length of the other one of the at least one buffer block structure 270 along the second horizontal direction hd2 may be greater than the second periodic pitch p2.

Figure 14C:
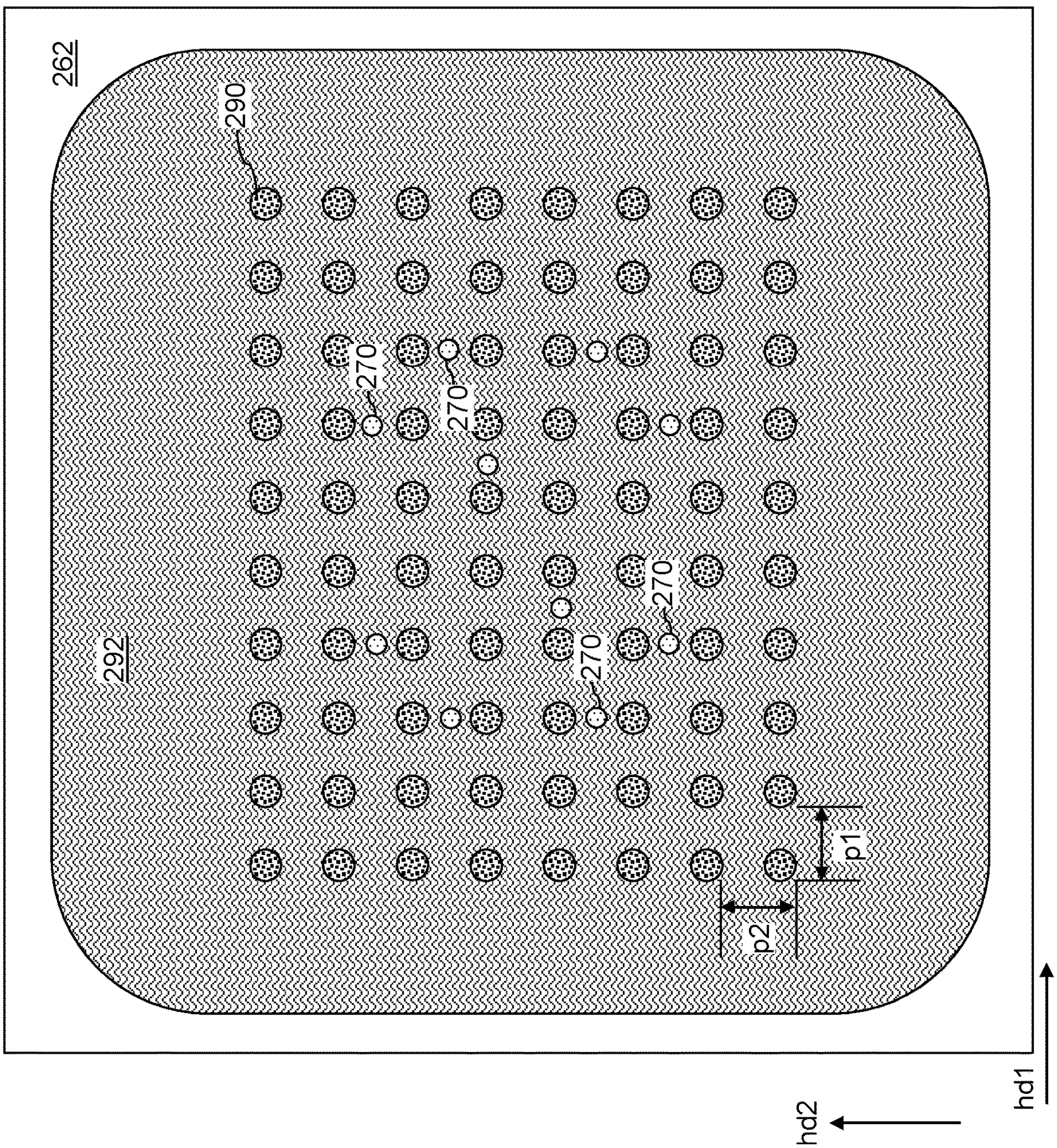
FIG. 14C is a horizontal cross-sectional view of a first alternative configuration of the packaging substrate at the processing steps of FIGS. 14A and 14B along a horizontal plane that is equivalent to the horizontal cross-sectional plane B-B' of FIG. 14A according to an embodiment of the present disclosure.

Referring to FIG. 14C, a horizontal cross-sectional view of the first alternative configuration of the packaging substrate 200 is shown at a processing step corresponding to the processing steps of FIGS. 14A and 14B along a horizontal plane that corresponds to the horizontal plane B-B' of FIG. 14A. The chip-side bonding pads 268 may be arranged as a two-dimensional array having the first periodic pitch p1 along the first horizontal direction hd1 and having the second periodic pitch p2 along the second horizontal direction hd2. In the illustrated first alternative configuration, one, a plurality, or each, of the at least one buffer block structure 270 may have a maximum dimension that is less than the first periodic pitch p1 and is less than the second periodic pitch p2. In one embodiment, one, a plurality, or each, of the at least one buffer block structure 270 may have a maximum dimension that is less than the lateral spacing between neighboring pairs of chip-side bonding pads 268 along the first horizontal direction hd1, and is less than the lateral spacing between neighboring pairs of chip-side bonding pads 268 along the second horizontal direction hd2. In one embodiment, the buffer block structures 270 may have a respective circular horizontal cross-sectional shape.

In one embodiment, the buffer block structures 270 may be located at each location, or at a subset of locations, between neighboring pairs chip-side bonding pads 268 that are laterally spaced apart along the first horizontal direction hd1 within an area that corresponds to the area of a fan-out package 900 to be subsequently bonded. Alternatively or additionally, the buffer block structures 270 may be located at each location, or at a subset of locations, between neighboring pairs chip-side bonding pads 268 that are laterally spaced apart along the second horizontal direction hd2 within the area that corresponds to the area of a fan-out package 900 to be subsequently bonded. In the illustrated configuration of FIG. 14C, the buffer block structures 270 may be formed at a subset that is less than the entirety of the locations between neighboring pairs of chip-side bonding pads.

In some embodiments, the chip-side bonding pads 268 may be arranged as a two-dimensional array having the first periodic pitch p1 along the first horizontal direction hd1 and having the second periodic pitch p2 along the second horizontal direction hd2. In some embodiment, the at least one buffer block structure 270 comprises a two-dimensional array of buffer blocking structures 270 having the first periodic pitch p1 along the first horizontal direction hd1 and having the second periodic pitch p2 along the second horizontal direction hd2, for example, as illustrated in FIGS. 12D and 12E.

Figure 14D:
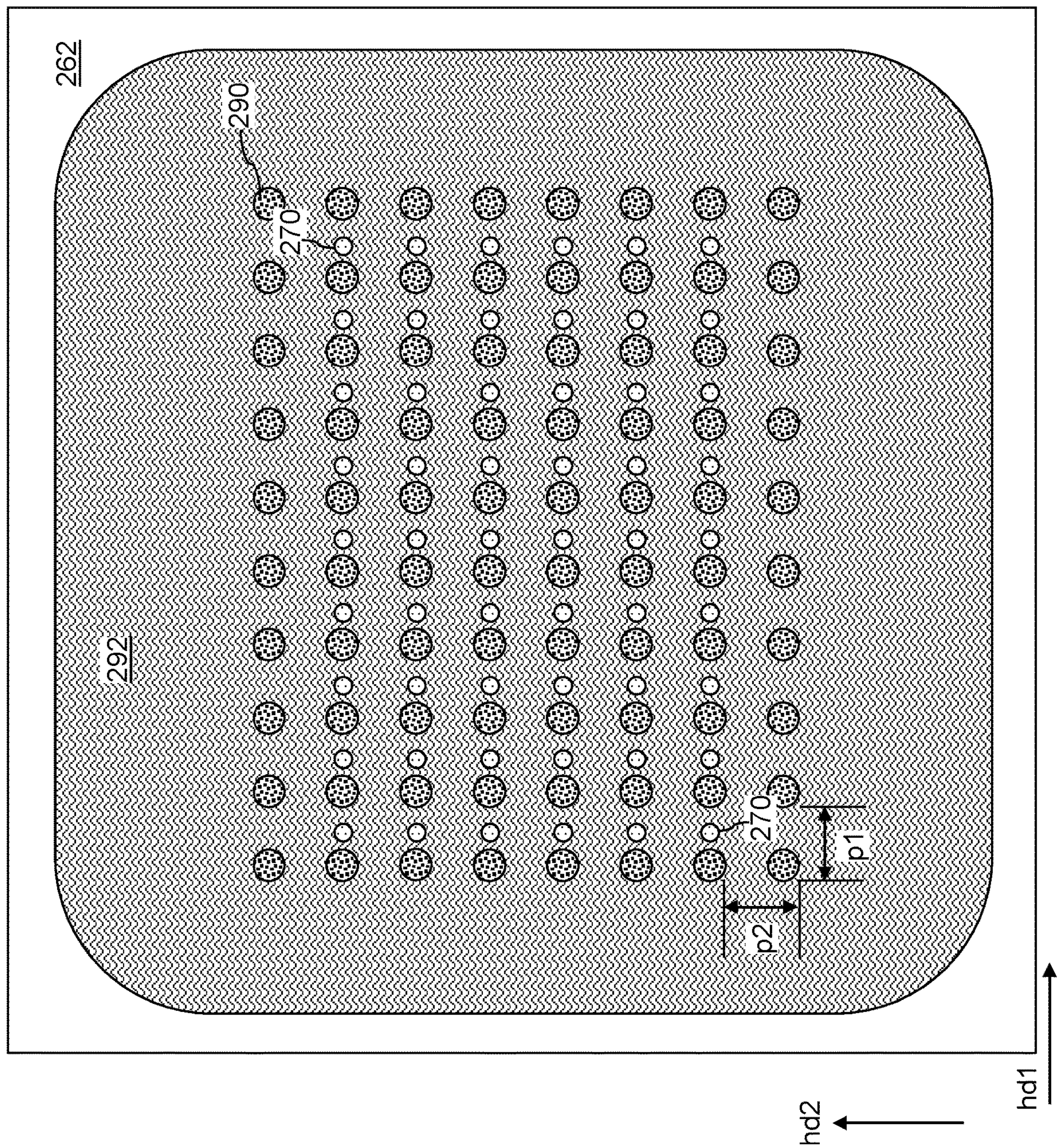
FIG. 14D is a horizontal cross-sectional view of a second alternative configuration of the packaging substrate at the processing steps of FIGS. 14A and 14B along a horizontal plane that is equivalent to the horizontal cross-sectional plane B-B' of FIG. 14A according to an embodiment of the present disclosure.

Referring to FIG. 14D, a horizontal cross-sectional view of the second alternative configuration of the packaging substrate 200 is shown at a processing step corresponding to the processing steps of FIGS. 14A and 14B along a horizontal plane that corresponds to the horizontal plane B-B' of FIG. 14A. In the second alternative configuration, the buffer block structures 270 may be located at each location between neighboring pairs chip-side bonding pads 268 that are laterally spaced apart along the first horizontal direction hd1 within an area that corresponds to the area of a fan-out package 900 to be subsequently bonded.

Figure 14E:
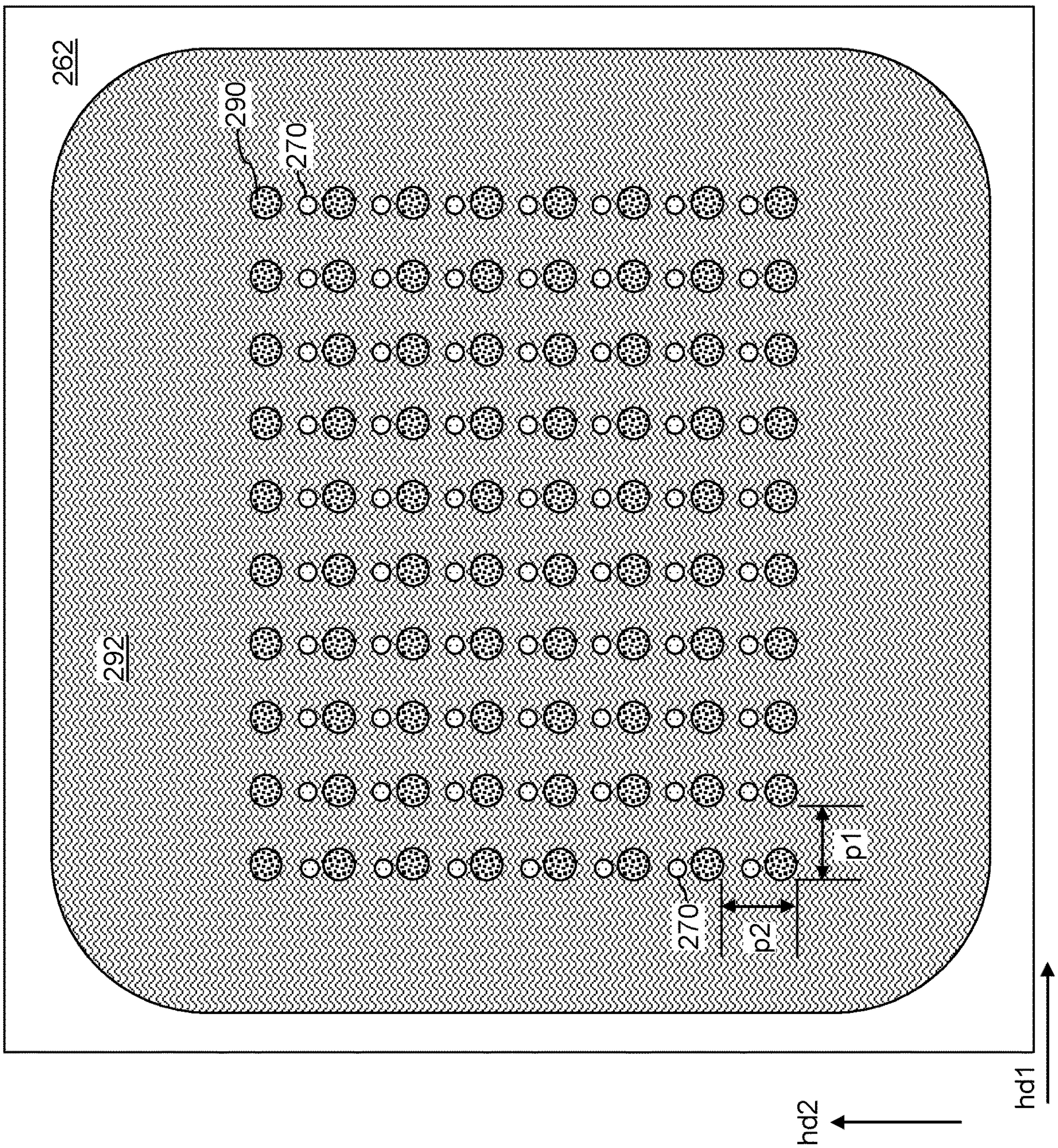
FIG. 14E is a horizontal cross-sectional view of a third alternative configuration of the packaging substrate at the processing steps of FIGS. 14A and 14B along a horizontal plane that is equivalent to the horizontal cross-sectional plane B-B' of FIG. 14A according to an embodiment of the present disclosure.

Referring to FIG. 14E, a horizontal cross-sectional view of the third alternative configuration of the packaging substrate 200 is shown at a processing step corresponding to the processing steps of FIGS. 14A and 14B along a horizontal plane that corresponds to the horizontal plane B-B' of FIG. 14A. In the third alternative configuration, the buffer block structures 270 may be located at each location between neighboring pairs chip-side bonding pads 268 that are laterally spaced apart along the second horizontal direction hd1 within an area that corresponds to the area of a fan-out package 900 to be subsequently bonded.

Figure 15:
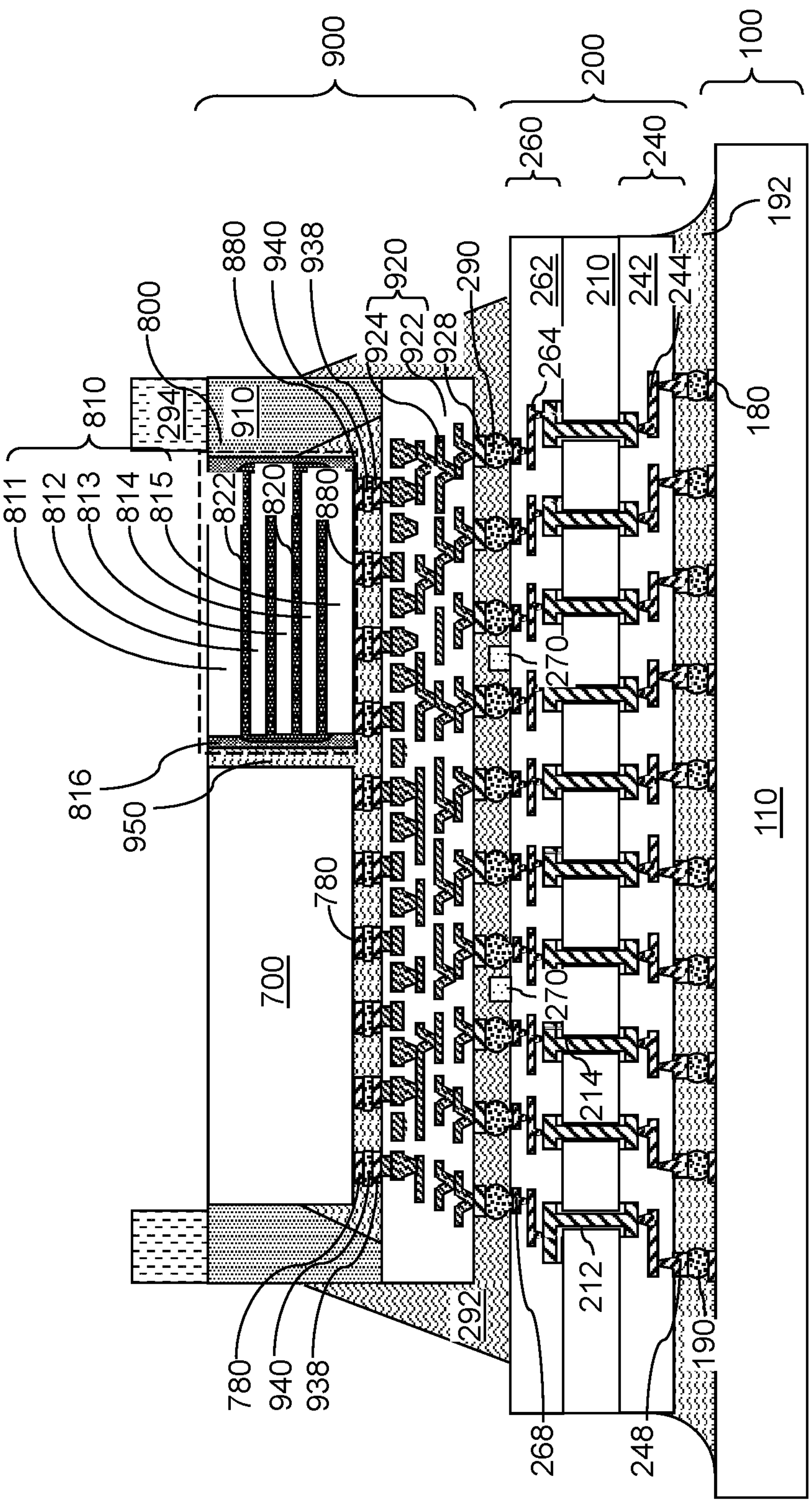
FIG. 15 is a vertical cross-sectional view of the exemplary structure after the packaging substrate is attached to a printed circuit board (PCB) according to an embodiment of the present disclosure.

Referring to FIG. 15, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The packaging substrate 200 is attached to the PCB 100 through the array of solder joints 190.

In the exemplary structure illustrated in FIG. 15, the at least one buffer block structure 270 contacts a horizontal surface of the packaging substrate 200, and is vertically spaced from the fan-out package 900 by a respective region of the second underfill material portion 292.

Figure 16:
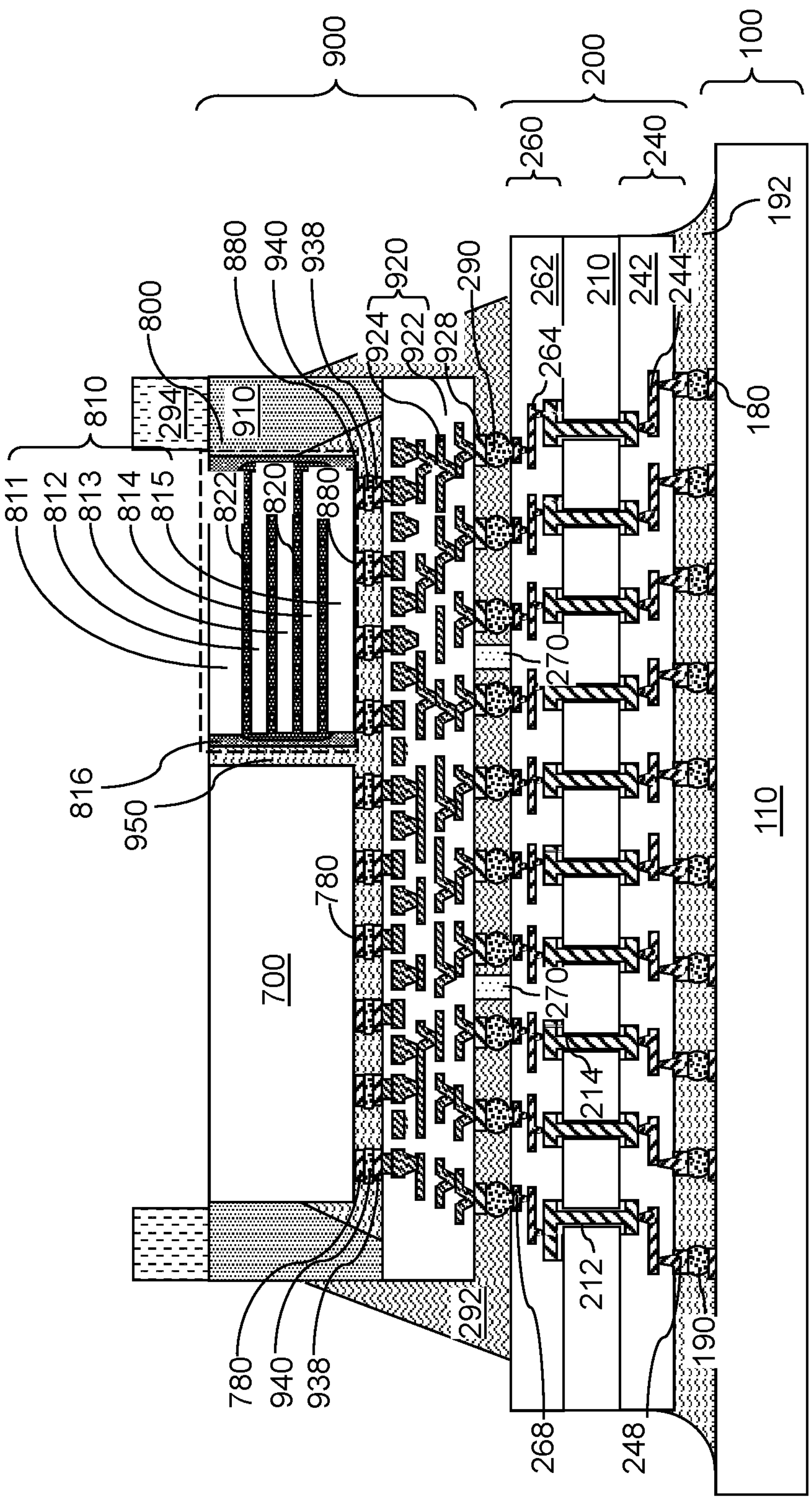
FIG. 16 is a vertical cross-sectional view of a first alternative embodiment of the exemplary structure after the packaging substrate is attached to a PCB.

Referring to FIG. 16, a first alternative embodiment of the exemplary structure is illustrated, which may be derived from the exemplary structure illustrated in FIG. 15 by modifying the height of the at least one buffer block structure 270. Specifically, the height of the at least one buffer block structure 270 may be the same as the vertical spacing between the packaging substrate 200 and the fan-out package 900. In this embodiment, the at least one buffer block structure 270 contacts a horizontal surface of the packaging substrate 200 and contacts a horizontal surface of the fan-out package 900.

Figure 17A:
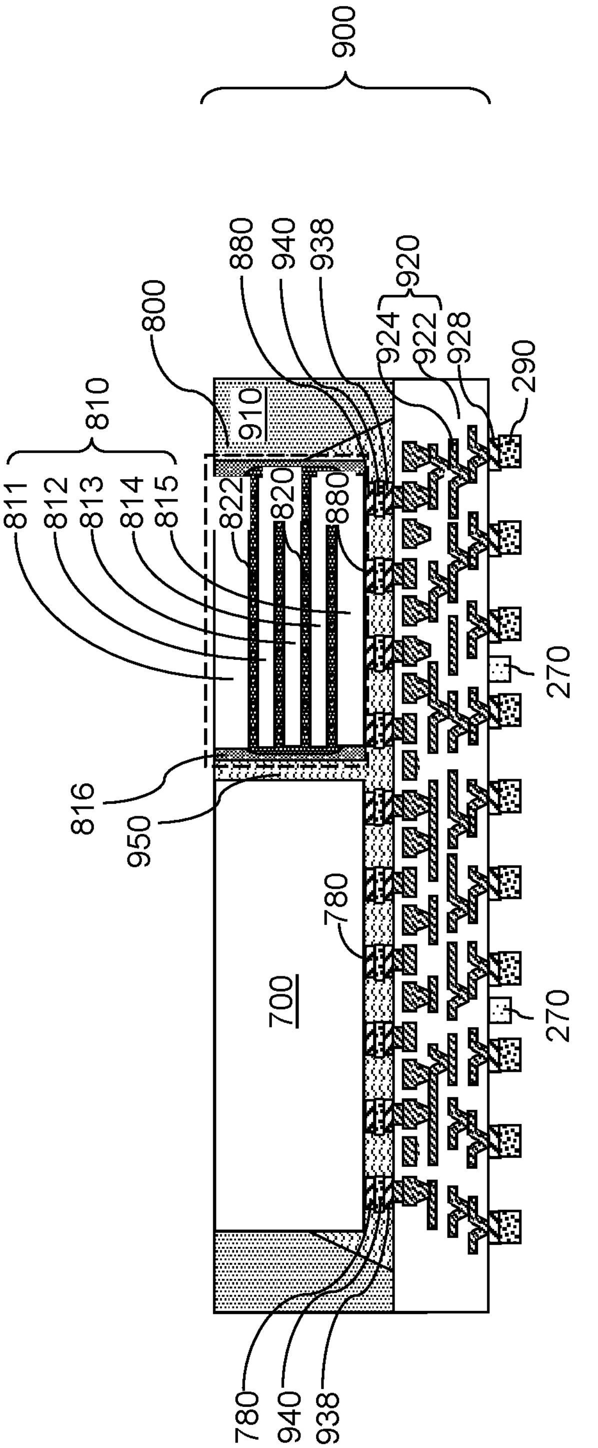
FIG. 17A is a vertical cross-sectional view of the fan-out package after formation of buffer block structures according to an embodiment of the present disclosure.
Figure 17B:
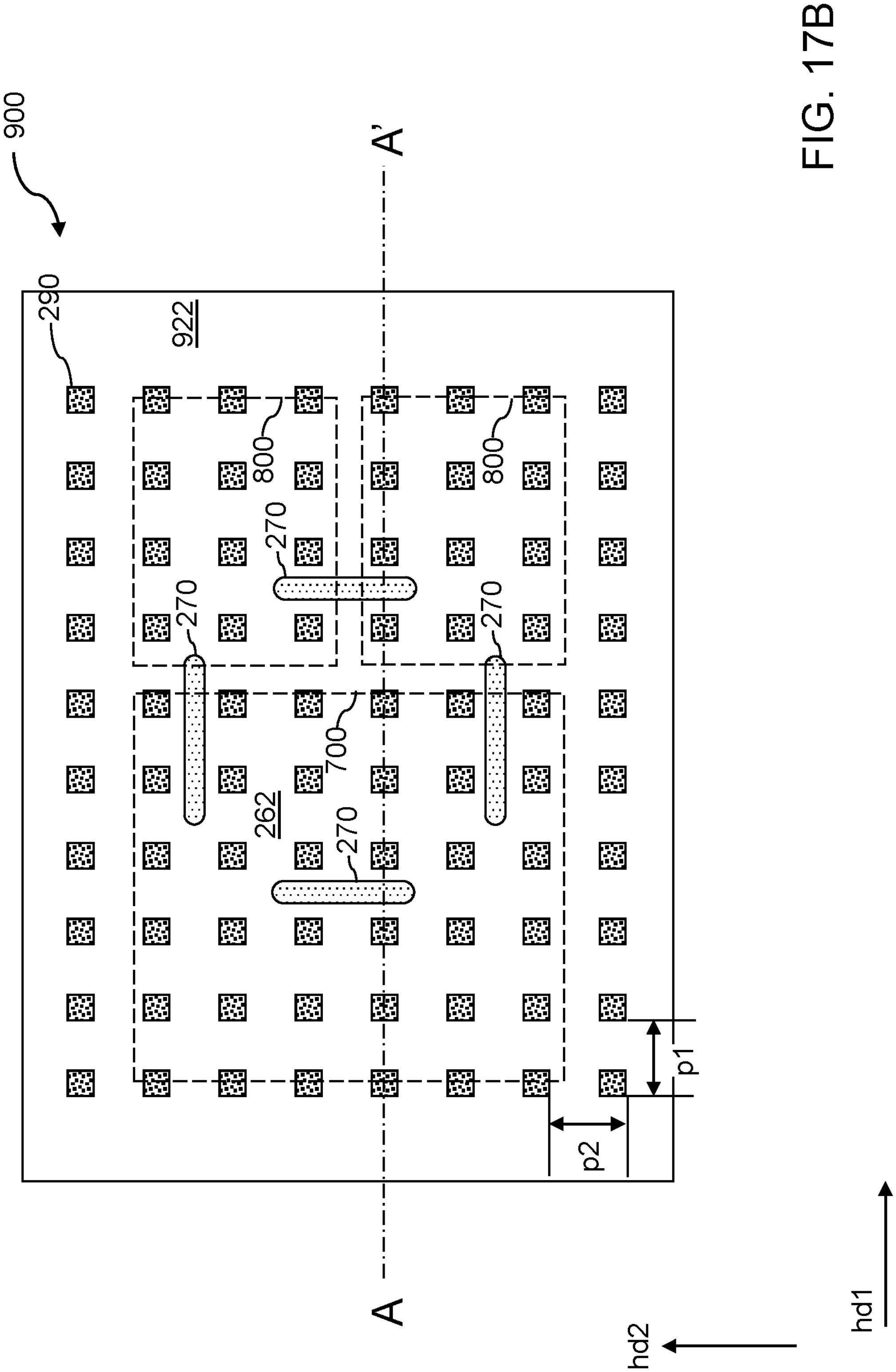
FIG. 17B is a bottom-up view of the fan-out package of FIG. 17A. The vertical plane A-A' is the plane of the vertical cross-section of FIG. 17A.

Referring to FIGS. 17A and 17B, a second alternative embodiment of the exemplary structure is illustrated, which may be derived from the exemplary structure illustrated in FIGS. 10A and 10B by forming at least one buffer block structure 270 on the bottom horizontal surface of the redistribution structure 920, which is the bottom surface of the fan-out package 900. The pattern of the at least one buffer block structure 270 may be a mirror image pattern of any of the patterns of the at least one buffer block structure 270 as formed on a top surface of the packaging substrate 200 described above.

Figure 17C:
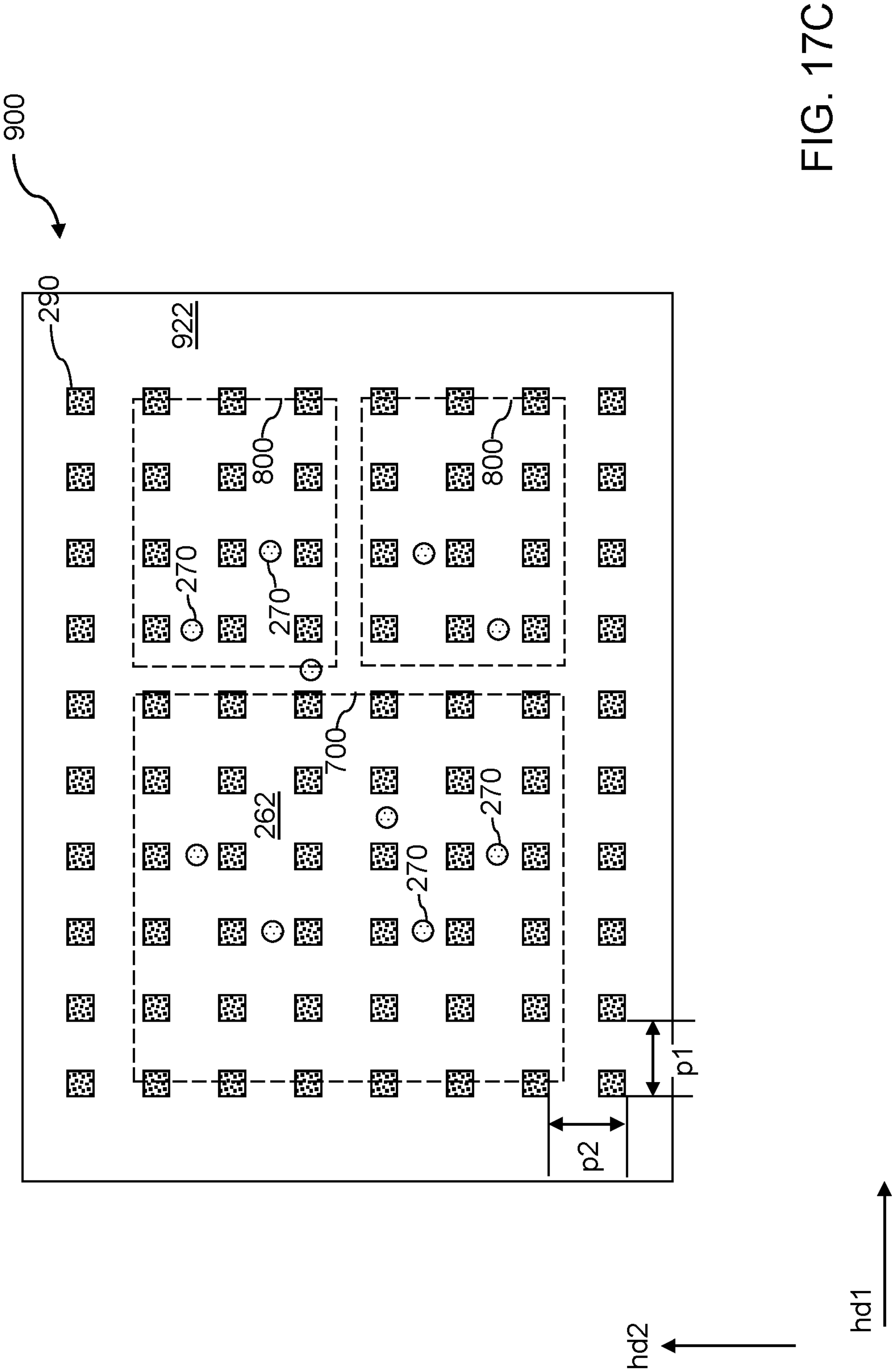
FIG. 17C is a bottom-up view of a first alternative configuration of the fan-out package at the processing steps of FIGS. 17A and 17B according to an embodiment of the present disclosure.
Figure 17D:
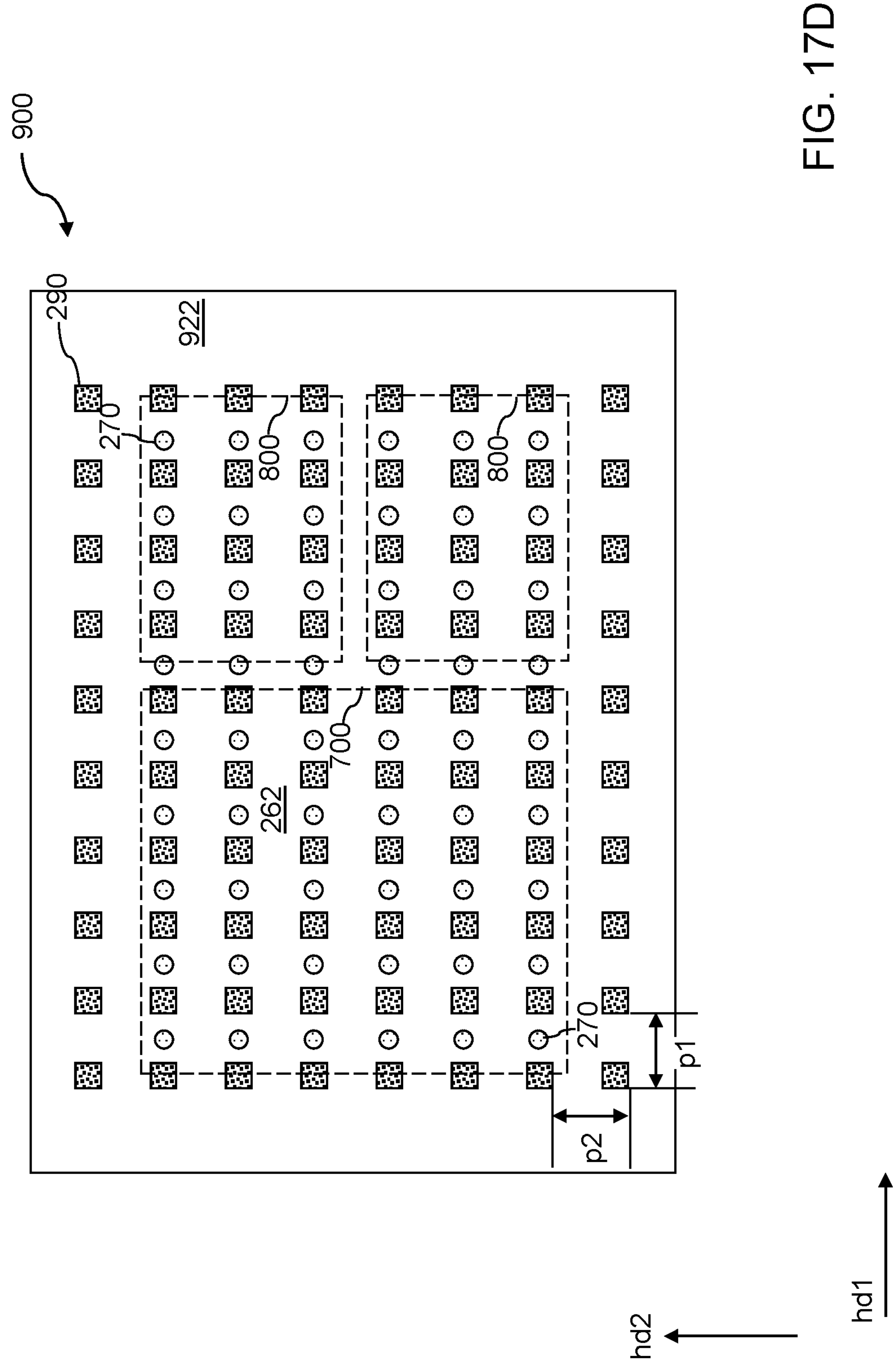
FIG. 17D is a bottom-up view of a second alternative configuration of the fan-out package at the processing steps of FIGS. 17A and 17B according to an embodiment of the present disclosure.
Figure 17E:
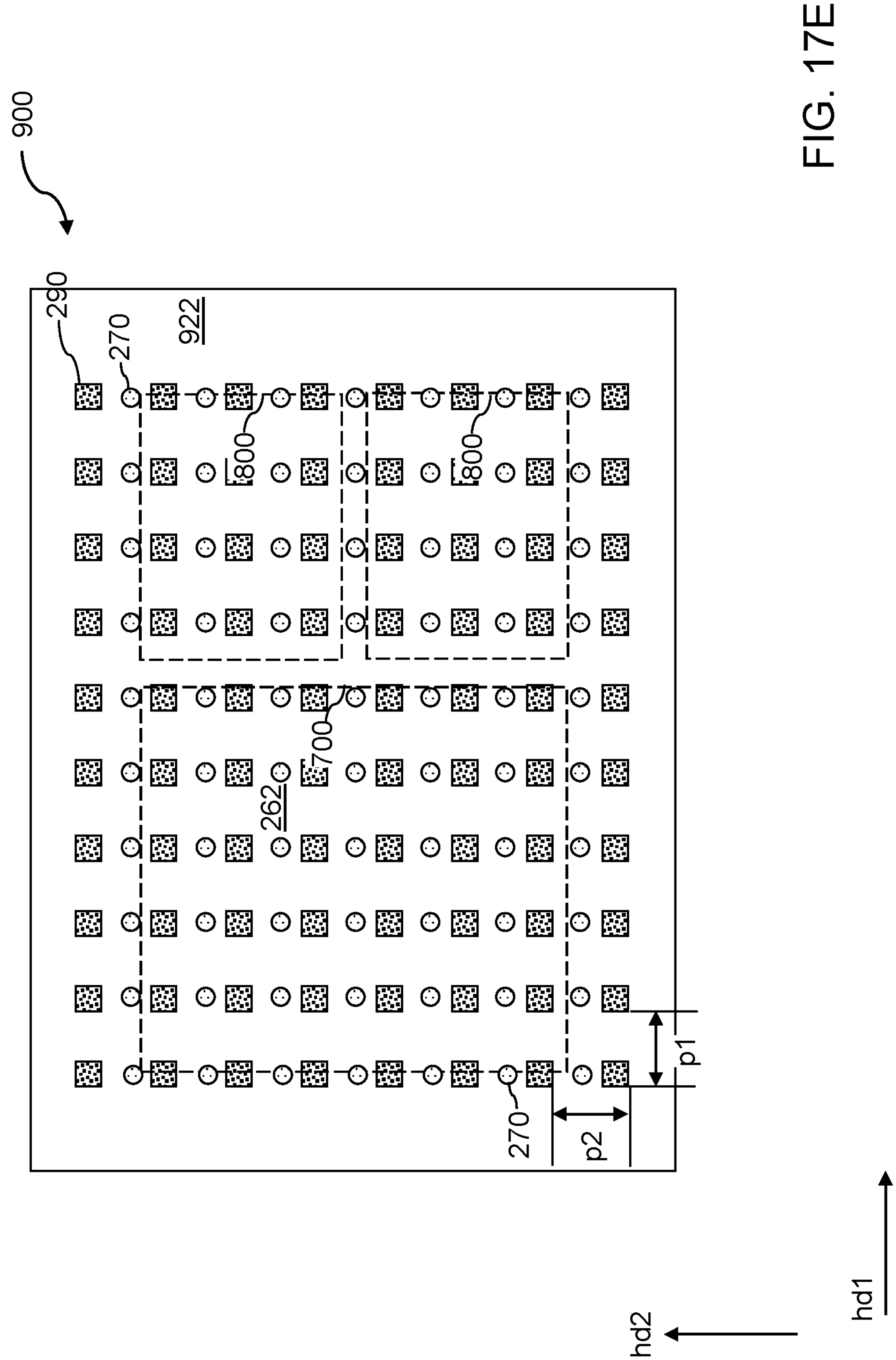
FIG. 17E is a bottom-up view of a third alternative configuration of the fan-out package at the processing steps of FIGS. 17A and 17B according to an embodiment of the present disclosure.

For example, the pattern of the at least one buffer block structure 270 in the alternative embodiment of the exemplary structure may be the mirror image pattern of the pattern of the at least one buffer block structure 270 described with reference to FIGS. 12A and 12B, or may be the mirror image pattern of the pattern of the at least one buffer block structure 270 described with reference to FIG. 12C as illustrated in FIG. 17C, or may be the mirror image pattern of the pattern of the at least one buffer block structure 270 described with reference to FIG. 12D as illustrated in FIG. 17D, or may be the mirror image pattern of the pattern of the at least one buffer block structure 270 described with reference to FIG. 12E as illustrated in FIG. 17E.

The at least one buffer block structure 270 illustrated in FIGS. 17A-17E may be formed by depositing a dielectric material over a horizontal surface of the redistribution structure 920 (such as the bottom surface of the redistribution structure 920 after the redistribution structure 920 is flipped upside down and disposed in a deposition chamber), and by patterning the dielectric material into the at least one buffer block structure 270 using a combination of lithographic patterning steps and an etch step. Generally, the at least one buffer block structure 270 in the alternative embodiment of the exemplary structure illustrated in FIGS. 17A-17E may have the same material composition and the same thickness range and the same general shape as the at least one buffer block structure 270 described with reference to FIGS. 12A-12E.

According to an aspect of the present disclosure, each of the at least one buffer block structure 270 may be formed on the fan-out package 900 between a respective neighboring pair of fan-out bonding pads 928 selected from the two-dimensional array of fan-out bonding pads 928, and between a respective neighboring pair of second solder material portions 290 selected from the two-dimensional array of second solder material portions 290. In one embodiment, each of the at least one buffer block structure 270 may have a minimum width between a parallel pair of sidewall segments having parallel vertical tangential planes (i.e., vertical planes that tangentially touch the sidewall segments of a respective buffer block structure 270 and are parallel to each other). The minimum width is less than the lateral spacing between a respective neighboring pair of fan-out bonding pads 928.

In one embodiment, each of the at least one buffer block structure 270 may have at least one vertical sidewall. In one embodiment, one, a plurality, and/or each, of the at least one buffer block structure 270 may have a respective a horizontal cross-sectional shape that is consistent under translation along a vertical direction that is perpendicular to a horizontal plane including the bottom surface of the fan-out package 900. In one embodiment, each of the at least one buffer block structure 270 has a horizontal cross-sectional shape of a rectangle, a rounded rectangle, a circle, or an ellipse, or any other two-dimensional shape having a closed periphery. Each of the at least one buffer block structure 270 comprises an inorganic dielectric material or a dielectric polymer material.

In one embodiment, the fan-out bonding pads 928 are arranged as a two-dimensional array having a first periodic pitch p1 along a first horizontal direction; and one of the at least one buffer block structure 270 may have a respective length along the first horizontal direction hd1 that is greater than a width along the second horizontal direction hd2 (which is perpendicular to the first horizontal direction hd1. In one embodiment, the length of the one of the at least one buffer block structure 270 along the first horizontal direction hd1 is greater than the first periodic pitch p1.

The width of each buffer block structure 270 is generally less than the spacing between a proximal neighboring pair of fan-out bonding pads 928. For example, the width each buffer block structure 270 may be in a range from 10 microns to 1 mm depending on the first periodic pitch p1 and the second periodic pitch p2 of the two-dimensional array of fan-out bonding pads 928, although lesser and greater widths may also be used. The length of each buffer block structure 270 may be in a range from 10 microns to 1 mm, although lesser and greater lengths may also be used. The length-to-width ratio of each buffer block structure 270 may be in a range from 1 to 100, although a greater length-to-width ratio may also be used. The height of each buffer block structure 270 is not greater than, and may be the same as, or may be less than, the separation distance between the fan-out package 900 and a packaging substrate 200 that is subsequently bonded to the fan-out package 900. In an illustrative example, the height of each buffer block structure 270 may be in a range from 30 microns to 150 microns, although lesser and greater heights may also be used. The ratio of the height of each buffer block structure 270 to the separation distance between the fan-out package 900 and a packaging substrate 200 that is subsequently bonded to the fan-out package 900 may be in a range from 0.40 to 1.0, although a lesser ratio may also be used.

Each of the at least one buffer block structure 270 has a respective horizontal cross-sectional shape, which may be a shape of a rectangle, a rounded rectangle, a circle, an ellipse, or a generally curvilinear two-dimensional shape having a closed periphery.

Figure 18:
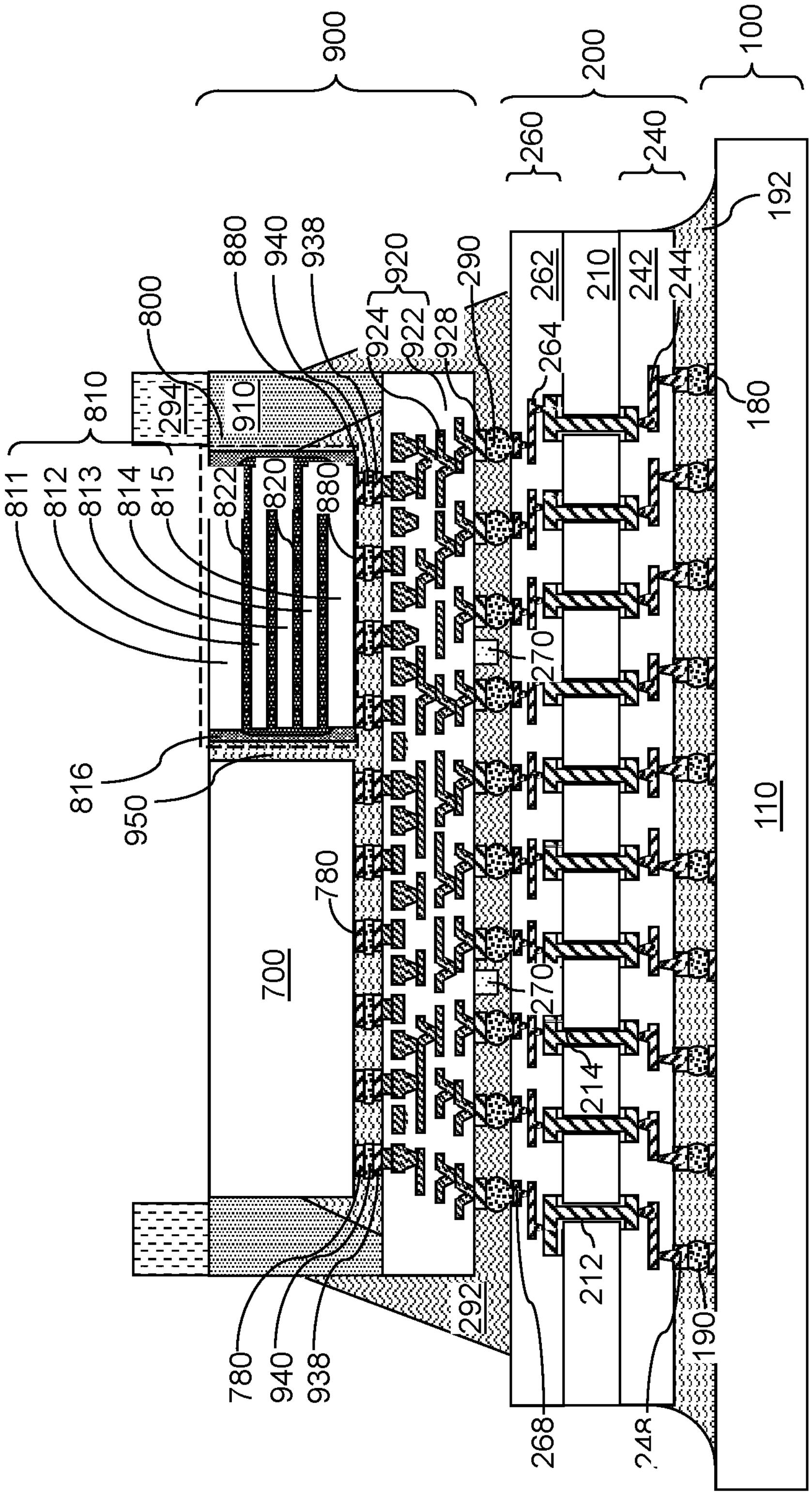
FIG. 18 is a vertical cross-sectional view of a second alternative embodiment of the exemplary structure after the packaging substrate is attached to a PCB.

Referring to FIG. 18, the processing steps of FIGS. 13, 14A-14E, and 15 may be subsequently performed mutatis mutandis to provide a second alternative embodiment of the exemplary structure. The at least one buffer block structure 270 contacts a horizontal surface of the redistribution structure 920, and may, or may not, contact a horizontal surface of the packaging substrate 200. In one embodiment, the at least one buffer block structure 270 contacts a horizontal surface of the fan-out package 900, and is vertically spaced from the packaging substrate 200 by the second underfill material portion 292. In another embodiment, the at least one buffer block structure 270 contacts a horizontal surface of the fan-out package 900 and contacts a horizontal surface of the packaging substrate 200.

Figure 19:
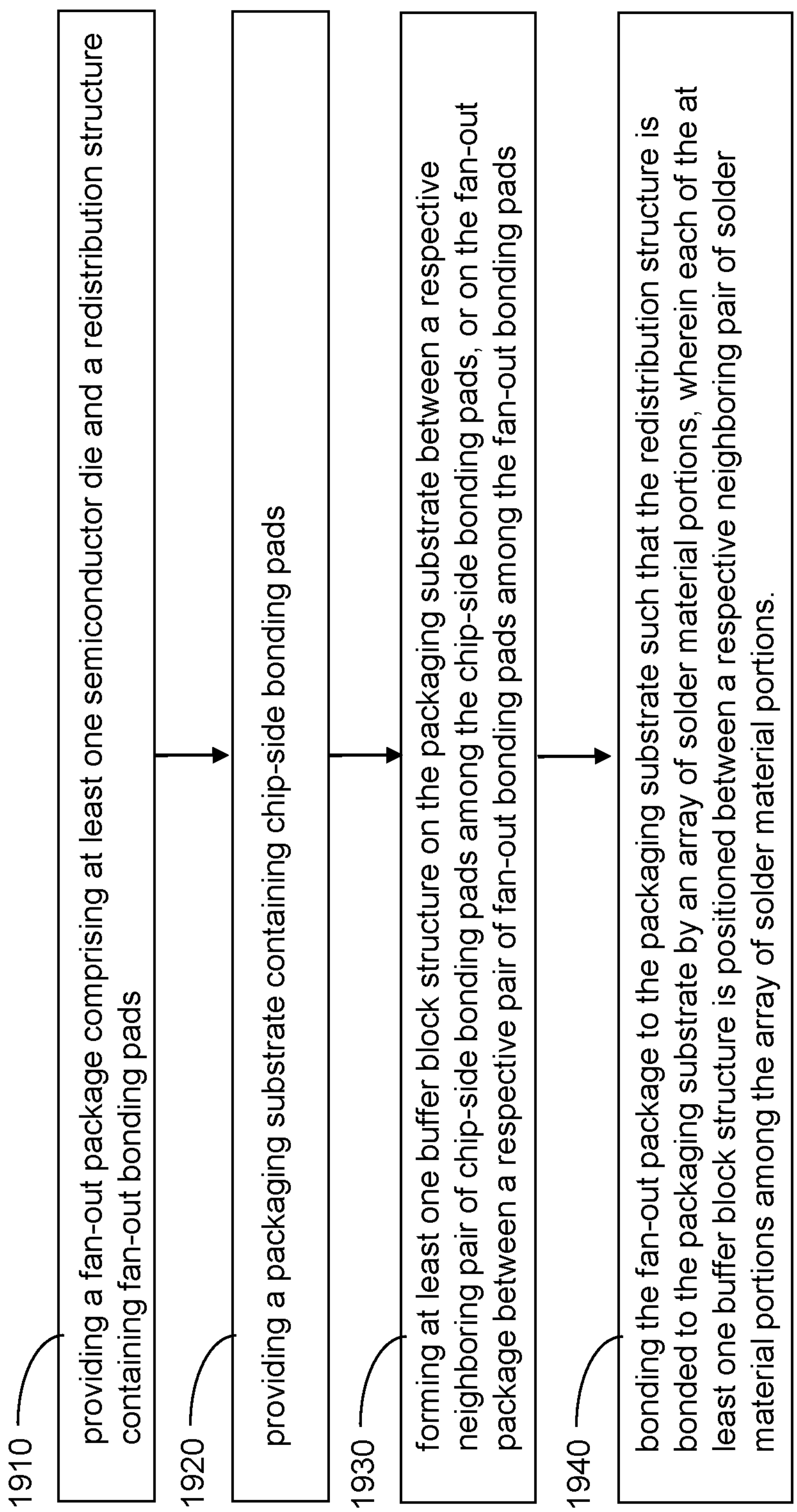
FIG. 19 is a flowchart illustrating steps for forming an exemplary structure according to an embodiment of the present disclosure.

Referring to FIG. 19, a flowchart illustrates exemplary processing steps for forming an exemplary structure according to an embodiment of the present disclosure.

Referring to step 1910 and FIGS. 1A-10B, a fan-out package 900 comprising at least one semiconductor die (700, 800) and a redistribution structure 920 containing fan-out bonding pads 928 is provided.

Referring to step 1920 and FIGS. 11A and 11B, a packaging substrate 200 containing chip-side bonding pads 268 is provided.

Referring to step 1930 and FIGS. 12A-12E and 17A-17E, at least one buffer block structure 270 is formed on the packaging substrate 200 between a respective neighboring pair of chip-side bonding pads 268 among the chip-side bonding pads 268, or on the fan-out package 900 between a respective pair of fan-out bonding pads 928 selected from the fan-out bonding pads 928.

Referring to step 1940 and FIGS. 13-16 and 18, the fan-out package 900 is bonded to the packaging substrate 200 such that the redistribution structure 920 is bonded to the packaging substrate 200 by an array of solder material portions 290. Each of the at least one buffer block structure 270 is positioned between a respective neighboring pair of solder material portions 290 selected from the array of solder material portions 290.

Referring to all drawings and according to various embodiments of the present disclosure, a semiconductor structure is provided, which may include: a fan-out package 900 comprising at least one semiconductor die (700, 800), a redistribution structure 920 comprising fan-out bonding pads 928, and a first underfill material portion 950 located between the at least one semiconductor die (700, 800) and the redistribution structure 920; a packaging substrate 200 comprising chip-side bonding pads 268; an array of solder material portions 290 bonded to the chip-side bonding pads 268 and the fan-out bonding pads 928; a second underfill material portion 292 laterally surrounding the array of solder material portions 290; and at least one buffer block structure 270 located between a respective neighboring pair of solder material portions 290 within the array of solder material portions 290 and between the fan-out package 900 and the packaging substrate 200, and laterally surrounded by the second underfill material portion 292.

In one embodiment, the at least one buffer block structure may be located within a projection area of the fan-out package in a plan view along a vertical direction that may be perpendicular to a horizontal plane including a surface of the packaging substrate that contacts the second underfill material portion. In one embodiment, one of the at least one buffer block structure may have a horizontal cross-sectional shape that is consistent under translation along a vertical direction that may be perpendicular to a horizontal plane including a surface of the packaging substrate that contacts the second underfill material portion. In one embodiment, each of the at least one buffer block structure 270 has a horizontal cross-sectional shape of a rectangle, a rounded rectangle, a circle, or an ellipse, or any other two-dimensional shape having a closed periphery. In one embodiment, the at least one buffer block structure may include an inorganic dielectric material or a dielectric polymer material. In one embodiment, the at least one buffer block structure may contact a horizontal surface of the packaging substrate and may contact a horizontal surface of the fan-out package. In one embodiment, the at least one buffer block structure may contact a horizontal surface of the packaging substrate, and may be vertically spaced from the fan-out package by the second underfill material portion. In one embodiment, the at least one buffer block structure may contact a horizontal surface of the fan-out package, and may be vertically spaced from the packaging substrate by the second underfill material portion. In one embodiment, the chip-side bonding pads may be arranged as a two-dimensional array having a first periodic pitch along a first horizontal direction; one of the at least one buffer block structure may have a length along the first horizontal direction that is greater than a width along a second horizontal direction that is perpendicular to the first horizontal direction; and the length of the one of the at least one buffer block structure along the first horizontal direction may be greater than the first periodic pitch. In one embodiment, the chip-side bonding pads may be arranged as a two-dimensional array having a first periodic pitch along a first horizontal direction and having a second periodic pitch along a second horizontal direction; and one of the at least one buffer block structure may have a maximum dimension that is less than the first periodic pitch and is less than the second periodic pitch. In one embodiment, the chip-side bonding pads may be arranged as a two-dimensional array having a first periodic pitch along a first horizontal direction and having a second periodic pitch along a second horizontal direction; and at least one buffer block structure may include a two-dimensional array of buffer blocking structures having the first periodic pitch along the first horizontal direction and having the second periodic pitch along the second horizontal direction.

According to another aspect of the present disclosure, a semiconductor structure is provided, which may include: a redistribution structure 920 that includes fan-out bonding pads 928; a packaging substrate 200 attached to the redistribution structure 928 by an array of solder material portions 290; an underfill material portion 292 laterally surrounding the array of solder material portions 290; and at least one buffer block structure 270 located between a respective neighboring pair of solder material portions 290 within the array of solder material portions 290 and between the redistribution structure 920 and the packaging substrate 200, and laterally surrounded by the underfill material portion 292.

In some embodiments, the at least one buffer block structure may include a material having a Young's modulus that is greater than a Young's modulus of the underfill material portion. In some embodiments, the underfill material portion may contact sidewalls of the redistribution structure. In some embodiments, one of the at least one buffer block structure may have a uniform height that is equal to, or is less than, a vertical spacing between a horizontal plane of the redistribution structure and a horizontal plane including a horizontal plane of the packaging substrate.

The various embodiments of the present disclosure may be used to reduce deformation of the second solder material portions 290 during bonding and application of the second underfill material and during subsequent handling of the bonded assembly to reduce formation of electrical opens or electrical shorts around the second solder material portions 290.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:

a fan-out package comprising at least one semiconductor die, a redistribution structure comprising fan-out bonding pads, and a first underfill material portion located between the at least one semiconductor die and the redistribution structure;

a packaging substrate comprising chip-side bonding pads;

an array of solder material portions bonded to the chip-side bonding pads and the fan-out bonding pads;

a second underfill material portion laterally surrounding the array of solder material portions; and at least one buffer block structure located between a respective neighboring pair of solder material portions within the array of solder material portions and between the fan-out package and the packaging substrate, and laterally surrounded by the second underfill material portion.

2. The semiconductor structure of claim 1, wherein the at least one buffer block structure is located within a projection area of the fan-out package in a plan view.

3. The semiconductor structure of claim 1, wherein one of the at least one buffer block structure has a horizontal cross-sectional shape that is consistent under translation along a vertical direction.

4. The semiconductor structure of claim 1, wherein the at least one buffer block structure comprises an inorganic dielectric material or a dielectric polymer material.

5. The semiconductor structure of claim 1, wherein the at least one buffer block structure contacts a horizontal surface of the packaging substrate and contacts a horizontal surface of the fan-out package.

6. The semiconductor structure of claim 1, wherein the at least one buffer block structure contacts a horizontal surface of the packaging substrate, and is vertically spaced from the fan-out package by the second underfill material portion.

7. The semiconductor structure of claim 1, wherein the at least one buffer block structure contacts a horizontal surface of the fan-out package, and is vertically spaced from the packaging substrate by the second underfill material portion.

8. The semiconductor structure of claim 1, wherein:

the chip-side bonding pads are arranged as a two-dimensional array having a first periodic pitch along a first horizontal direction;

one of the at least one buffer block structure has a length along the first horizontal direction that is greater than a width along a second horizontal direction that is perpendicular to the first horizontal direction; and the length of the one of the at least one buffer block structure along the first horizontal direction is greater than the first periodic pitch.

9. The semiconductor structure of claim 1, wherein:

the chip-side bonding pads are arranged as a two-dimensional array having a first periodic pitch along a first horizontal direction and having a second periodic pitch along a second horizontal direction; and one of the at least one buffer block structure has a maximum dimension that is less than the first periodic pitch and is less than the second periodic pitch.

10. The semiconductor structure of claim 1, wherein:

the chip-side bonding pads are arranged as a two-dimensional array having a first periodic pitch along a first horizontal direction and having a second periodic pitch along a second horizontal direction; and at least one buffer block structure comprises a two-dimensional array of buffer blocking structures having the first periodic pitch along the first horizontal direction and having the second periodic pitch along the second horizontal direction.

11. A semiconductor structure comprising:

a redistribution structure comprising fan-out bonding pads;

a packaging substrate attached to the redistribution structure by an array of solder material portions;

an underfill material portion laterally surrounding the array of solder material portions; and at least one buffer block structure located between a respective neighboring pair of solder material portions within the array of solder material portions and between the redistribution structure and the packaging substrate, and laterally surrounded by the underfill material portion.

12. The semiconductor structure of claim 11, wherein the at least one buffer block structure comprises a material having a Young's modulus that is greater than a Young's modulus of the underfill material portion.

13. The semiconductor structure of claim 11, wherein:

each of the at least one buffer block structure has a horizontal cross-sectional shape of a rectangle, a rounded rectangle, a circle, or an ellipse; and the underfill material portion contacts sidewalls of the redistribution structure.

14. The semiconductor structure of claim 11, wherein one of the at least one buffer block structure has a uniform height that is equal to, or is less than, a vertical spacing between a horizontal plane of the redistribution structure and a horizontal plane including a horizontal plane of the packaging substrate.

15. A method of forming a semiconductor structure, comprising:

providing a fan-out package comprising at least one semiconductor die and a redistribution structure containing fan-out bonding pads;

providing a packaging substrate containing chip-side bonding pads;

forming at least one buffer block structure on the packaging substrate between a respective neighboring pair of chip-side bonding pads selected from the chip-side bonding pads, or on the fan-out package between a respective pair of fan-out bonding pads selected from the fan-out bonding pads; and bonding the fan-out package to the packaging substrate such that the redistribution structure is bonded to the packaging substrate by an array of solder material portions, wherein each of the at least one buffer block structure is positioned between a respective neighboring pair of solder material portions selected from the array of solder material portions.

16. The method of claim 15, further comprising applying an underfill material portion around the array of solder material portions and around each of the at least one buffer block structure.

17. The method of claim 15, wherein forming the at least one buffer block structure comprises:

depositing a dielectric material over a horizontal surface of the packaging substrate; and patterning the dielectric material into the at least one buffer block structure.

18. The method of claim 15, wherein forming the at least one buffer block structure comprises:

depositing a dielectric material over a horizontal surface of the redistribution structure; and patterning the dielectric material into the at least one buffer block structure.

19. The method of claim 15, wherein the at least one buffer block structure is positioned within an area of the fan-out package in a plan view along a vertical direction that is perpendicular to horizontal surfaces of the fan-out package and the packaging substrate that face each other upon bonding the fan-out package to the packaging substrate.

20. The method of claim 15, wherein the at least one buffer block structure comprises an inorganic dielectric material or a dielectric polymer material.

* * * * *